(12) United States Patent
Hamade

(10) Patent No.: US 12,446,428 B2
(45) Date of Patent: Oct. 14, 2025

(54) OPTICAL MODULATION DEVICE AND DISPLAY DEVICE

(71) Applicant: SEIKO EPSON CORPORATION, Tokyo (JP)

(72) Inventor: Yuiga Hamade, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 407 days.

(21) Appl. No.: 18/193,619

(22) Filed: Mar. 30, 2023

(65) Prior Publication Data

US 2023/0354666 A1   Nov. 2, 2023

(30) Foreign Application Priority Data

Mar. 31, 2022   (JP) ................. 2022-059239

(51) Int. Cl.
*H10K 59/30*   (2023.01)
*G02B 27/01*   (2006.01)
*H10K 102/00*  (2023.01)

(52) U.S. Cl.
CPC ......... *H10K 59/30* (2023.02); *G02B 27/0172* (2013.01); *G02B 2027/0178* (2013.01); *G02B 2207/117* (2013.01); *H10K 2102/302* (2023.02); *H10K 2102/351* (2023.02)

(58) Field of Classification Search
CPC ............................................. G02B 27/0172
See application file for complete search history.

(56) References Cited

U.S. PATENT DOCUMENTS

| 2011/0127524 | A1  | 6/2011 | Yamazaki et al. |
| 2015/0228930 | A1* | 8/2015 | Murata ................ H10K 50/856 |
| | | | 438/29 |
| 2020/0117075 | A1  | 4/2020 | Koshihara |
| 2020/0278549 | A1* | 9/2020 | Yamamoto .......... G02B 27/141 |
| 2020/0278559 | A1* | 9/2020 | Hamade ............. G02B 27/0172 |

FOREIGN PATENT DOCUMENTS

| JP | 2000275732 | 10/2000 |
| JP | 2019033288 | 2/2019 |
| JP | 2019135589 | 8/2019 |
| JP | 2020060685 | 4/2020 |

* cited by examiner

*Primary Examiner* — Christine S. Kim
*Assistant Examiner* — Cole Leon Lindsey
(74) *Attorney, Agent, or Firm* — JCIPRNET

(57) ABSTRACT

An optical modulation device includes a first electro-optical device including a first light-emitting element including a light-emitting layer emitting light including a red wavelength region, a second electro-optical device including a second light-emitting element including a light-emitting layer emitting light including a green wavelength region, a third electro-optical device including a third light-emitting element including a light-emitting layer emitting light including a blue wavelength region, and a prism that synthesizes light emitted from the first, second and third electro-optical devices. Each of the first, second and third light-emitting elements includes a first electrode, a second electrode, and a conductive layer provided therebetween and having a lower reflectance with respect to the light emitted from the light-emitting layer than from the first electrode. A thickness of the conductive layer of the third light-emitting element is thinner than thicknesses of the conductive layers of the first and second light-emitting elements.

9 Claims, 10 Drawing Sheets

OPTICAL MODULATION DEVICE AND DISPLAY DEVICE

The present application is based on, and claims priority from JP Application Serial Number 2022-059239, filed Mar. 31, 2022, the disclosure of which is hereby incorporated by reference herein in its entirety.

BACKGROUND

1. Technical Field

The present disclosure relates to an optical modulation device and a display device.

2. Related Art

In recent years, organic electro-luminescence (EL) panels using thin film transistors (TFTs) or silicon (Si) semiconductor for a backplane have been developed. For example, in a display device including a projector, an image light generation device can be realized by using an organic EL panel (an electro-optical device) instead of using a combination of a light source device that generates red light, green light and blue light, and a liquid crystal panel on which each of the colors of light emitted from the light source device is incident and which generates image light corresponding to each of the colors.

For example, in JP-A-2020-060685, an image light generation device (an optical modulation device) is disclosed that includes a first image display panel, a second image display panel, and a third image display panel respectively corresponding to light of three colors, and a cross dichroic prism that synthesizes image light emitted from each of the image display panels.

In the above-described image light generation device disclosed in JP-A-2020-060685, lifetime characteristics of the image display panel largely depend on optical characteristics of a luminescent material used for the image display panel, and on the configuration of the image display panel. Thus, it is considered that the lifetime characteristics of the first image display panel, the second image display panel, and the third image display panel are different from each other depending on a difference in the wavelength region of the color light corresponding to each of the image display panels. When an image light generation device or a display device is configured by using a plurality of image display panels having mutually different lifetime characteristics as described above, a color shift may occur in synthesized light obtained by synthesizing color light beams or image light beams output from the plurality of image display panels due to a difference in a deterioration rate when the image display panels are driven. As a result, there is a risk that the quality of the image light generation device or the display device may deteriorate.

SUMMARY

In order solve the problem described above, an optical modulation device according to an aspect of the present disclosure includes a first electro-optical device including a first light-emitting element including a light-emitting layer emitting light including a red wavelength region, a second electro-optical device including a second light-emitting element including a light-emitting layer emitting light including a green wavelength region, a third electro-optical device including a third light-emitting element including a light-emitting layer emitting light including a blue wavelength region, and a prism configured to synthesize light emitted from the first electro-optical device, the second electro-optical device, and the third electro-optical device. Each of the first light-emitting element, the second light-emitting element and the third light-emitting element includes a first electrode, a second electrode, and a conductive layer provided between the first electrode and the light-emitting layer, and having a lower reflectance with respect to the light emitted from the light-emitting layer than a reflectance of the first electrode. A thickness of the conductive layer of the third light-emitting element is thinner than a thickness of the conductive layer of the first light-emitting element and a thickness of the conductive layer of the second light-emitting element.

DESCRIPTION OF EXEMPLARY EMBODIMENTS

First Embodiment

A first embodiment of the present disclosure will be described below with reference to FIGS. 1 to 8. In each of the drawings described below, the dimensions of some components may be scaled differently in order to make it easier to view each of the components.

Optical Modulation Device

Figure 1:
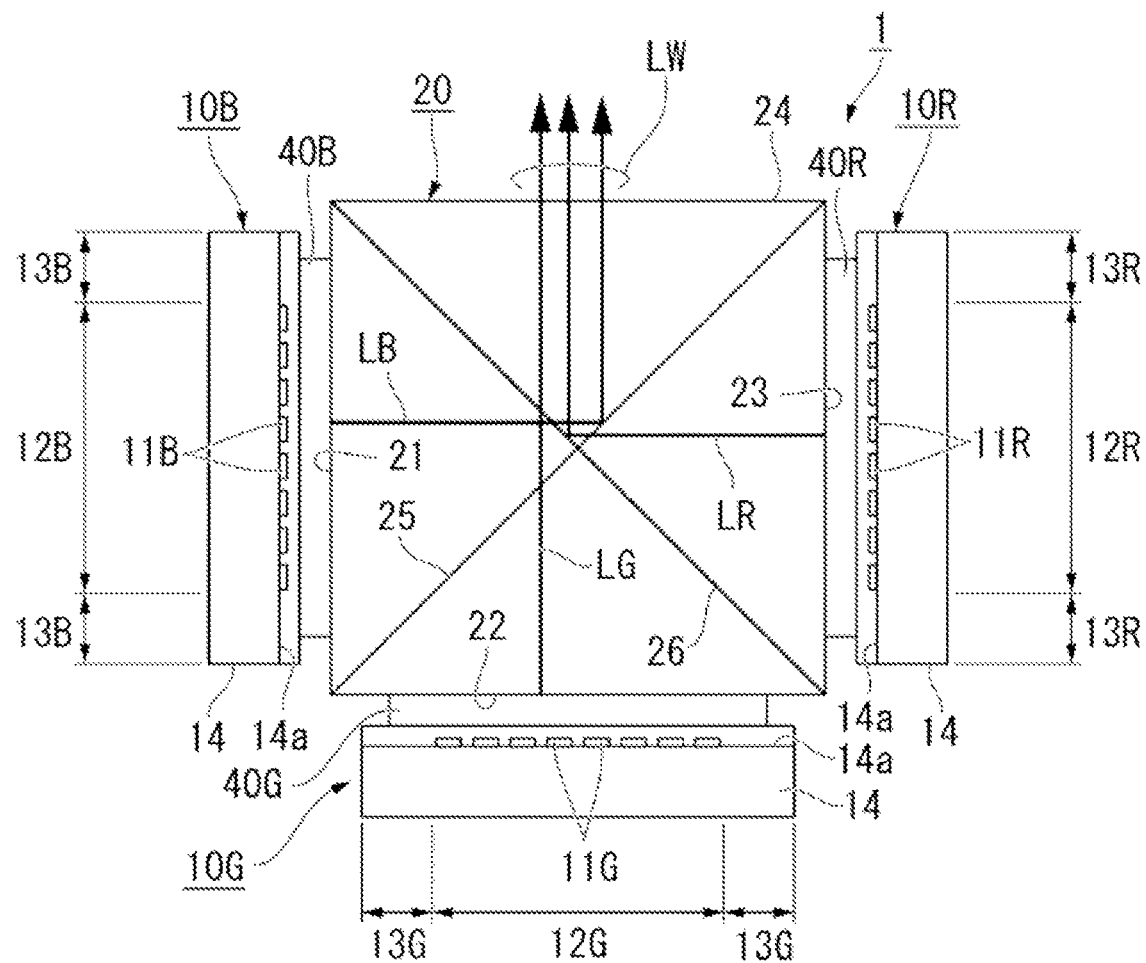
FIG. 1 is a schematic view illustrating a configuration of an optical modulation device according to a first embodiment.

FIG. 1 is a schematic view illustrating a configuration of an optical modulation device 1 according to the first embodiment. As illustrated in FIG. 1, the optical modulation device 1 includes electro-optical devices 10R, 10G, 10B, and a dichroic prism 20.

The electro-optical device 10R is a self-light emission type electro-optical device that emits red image light LR to the dichroic prism 20. The electro-optical device 10R is a device in which, for example, an organic light-emitting diode (OLED) is used as a light-emitting element, and includes a pixel region 12R including a plurality of pixels 11R, and a non-pixel region 13R. A red wavelength region of the image light LR includes a wavelength region from 610 nm to 680 nm, for example. The plurality of pixels 11R of the electro-optical device 10R emits red light. The image light LR emitted from the electro-optical device 10R is constituted by the red light that is emitted from each of the plurality of pixels 11R, and that is modulated by an image signal input to the plurality of pixels 11R.

A surface 14a of a substrate 14 of the electro-optical device 10R faces an incident surface 23 of the red light of the dichroic prism 20, and is bonded to the incident surface 23 via a transmissive adhesive layer 40R. In other words, the electro-optical device 10R is disposed so that the image light LR is perpendicularly incident on the incident surface 23.

The electro-optical device 10G is a self-light emission type electro-optical device that emits green image light LG to the dichroic prism 20. Similarly, for the electro-optical device 10R, the electro-optical device 10R is a device in which, for example, the OLED is used as the light-emitting element, and includes a pixel region 12G including a plurality of pixels 11G, and a non-pixel region 13G. A green wavelength region of the image light LR includes a wavelength region from 495 nm to 570 nm, for example. The plurality of pixels 11G of the electro-optical device 10G emit green light. The image light LG emitted from the electro-optical device 10G is constituted by the green light emitted from each of the plurality of pixels 11G, and modulated by an image signal input to the plurality of pixels 11G.

The surface 14a of the substrate 14 of the electro-optical device 10G faces an incident surface 22 of the green light of the dichroic prism 20, and is bonded to the incident surface 22 via a transmissive adhesive layer 40G. In other words, the electro-optical device 10G is disposed so that the image light LG is perpendicularly incident on the incident surface 22.

The electro-optical device 10B is a self-light emission type electro-optical device that emits blue image light LB to the dichroic prism 20. Similarly, for the electro-optical devices 10R and 10G, the electro-optical device 10B is a device in which, for example, the OLED is used as the light-emitting element, and includes a pixel region 12B including a plurality of pixels 11B, and a non-pixel region 13B. In other words, each of the electro-optical panels 10R, 10G, 10B is an organic electro-luminescence (EL) panel. A blue wavelength region of the image light LB includes a wavelength region from 450 nm to 490 nm, for example. The plurality of pixels 11B of the electro-optical device 10B emit blue light. The image light LB emitted from the electro-optical device 10B is constituted by the blue light emitted from each of the plurality of pixels 11B.

The surface 14a of the substrate 14 of the electro-optical device 10B faces an incident surface 21 of the blue light of the dichroic prism 20, and is bonded to the incident surface 21 via a transmissive adhesive layer 40B. In other words, the electro-optical device 10B is disposed so that the image light LB is perpendicularly incident on the incident surface 21.

Each of the image light LG, LB, and LR does not have any polarization characteristics, and is unpolarized light that does not have a specific vibration direction. Note that the unpolarized light, that is, light having no polarization characteristics is not completely in a unpolarized state, and includes a certain polarization component. For example, the light has a degree of polarization to the extent that does not actively affect the optical performance of optical components including a dichroic mirror.

The dichroic prism 20 is constituted by a light transmissive member having a quadrangular columnar shape. Further, the light transmissive member having the quadrangular columnar shape is constituted by combining four light transmissive members each having a triangular columnar shape. The dichroic prism 20 includes the incident surfaces 21, 22, and 23, and an emission surface 24. The dichroic prism 20 includes a first dichroic mirror 25 that does not have any polarization separation characteristics, and a second dichroic mirror 26 that does not have any polarization separation characteristics. The first dichroic mirror 25 and the second dichroic mirror 26 intersect with each other at an angle of 90° in plan view. The first dichroic mirror 25 reflects the image light LB incident on the first dichroic mirror 25 via the incident surface 21 toward the emission surface 24, and transmits the image light LG incident on the first dichroic mirror 25 via the incident surface 22 toward the emission surface 24. The second dichroic mirror 26 reflects the image light LR incident on the second dichroic mirror 26 via the incident surface 23 toward the emission surface 24, and transmits the image light LG incident on the second dichroic mirror 25 via the incident surface 22 toward the emission surface 24. Due to the characteristics of the first dichroic mirror 25 and the second dichroic mirror 26, synthesized image light LW, which is generated as a result of the image light LG, LB, and LR being synthesized with one another, is emitted from the emission surface 24.

Figure 2:
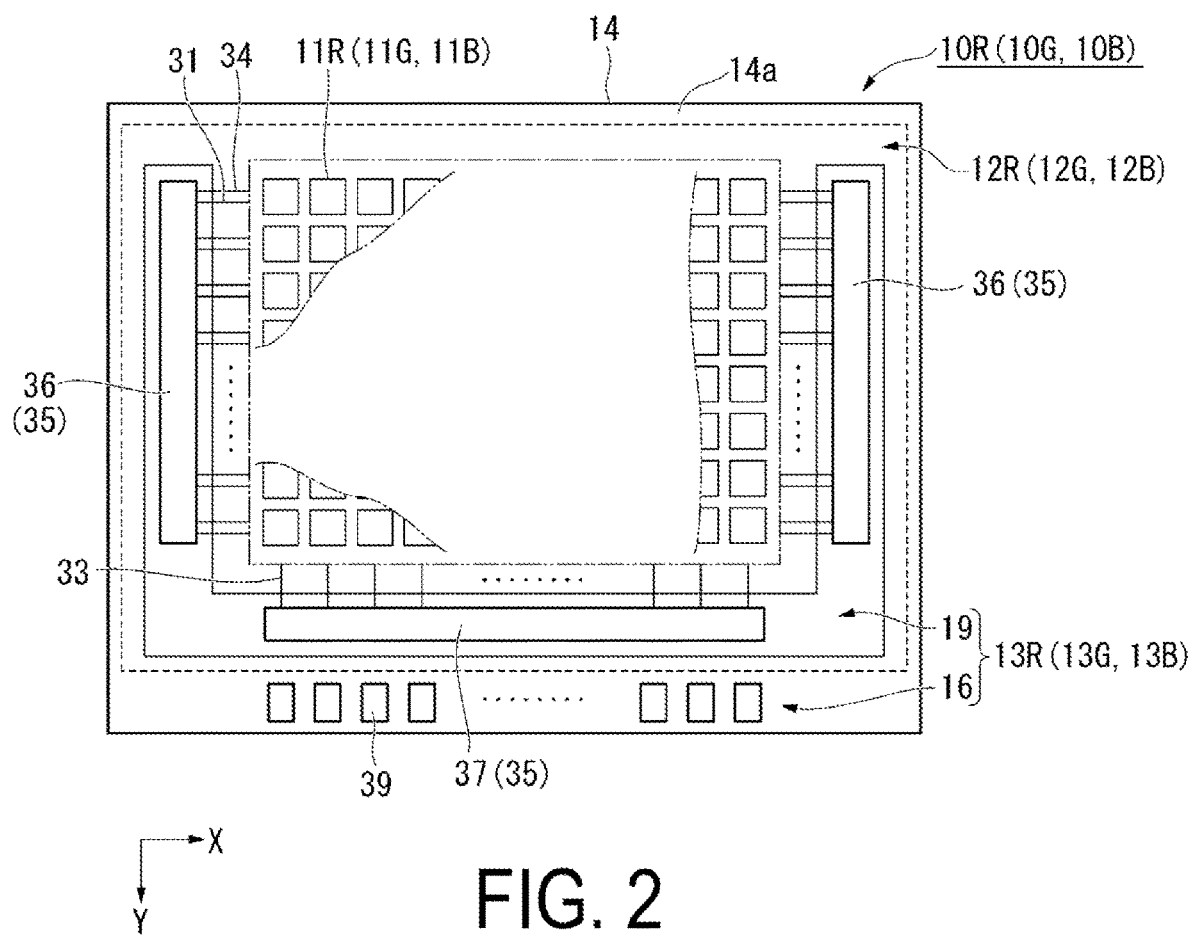
FIG. 2 is a schematic view illustrating a configuration of an electro-optical device of the optical modulation device illustrated in FIG. 1.

Electro-optical Device Next, a configuration of the electro-optical device 10R will be described. FIG. 2 is a plan view illustrating the configuration of the electro-optical device 10R. Hereinafter, the horizontal direction of the surface 14a of the substrate 14 of the electro-optical device 10R will be referred to as an X direction, and the vertical direction orthogonal to the X direction of the surface 14a will be referred to as a Y direction. As illustrated in FIG. 2, the surface 14a includes the pixel region 12R and the non-pixel region 13R. In the pixel region 12R, the plurality of pixels 11R are arranged in a matrix pattern along the X direction and the Y direction. The pixel region 12R is a rectangular region when viewed from a direction orthogonal to the X direction and the Y direction. Hereinafter, a state viewed from the direction orthogonal to the X direction and the Y direction may be described as plan view. A plurality of scanning lines 31 extending parallel to the X direction and a plurality of data lines 33 extending parallel to the Y direction are provided in the pixel region 12R. The pixel 11R is constituted so as to correspond to each of regions at which the plurality of scanning lines 31 and the plurality of data lines 33 intersect with each other. A pixel circuit included in the pixel 11R will be described later.

The non-pixel region 13R includes a peripheral region 19 and a mounting region 16. The peripheral region 19 is a frame-shaped rectangular region surrounding the pixel region 12R when viewed from the direction orthogonal to the X direction and the Y direction. A drive circuit 35 that drives the plurality of pixels 11R is provided in the peripheral region 19. The drive circuit 35 includes scanning line drive circuits 36 and a data line drive circuit 37. As described above, since the drive circuit 35 is formed on the surface 14a of the substrate 14 in the electro-optical device 10R, the electro-optical device 10R is a circuit-embedded device constituted by an active element provided with a transistor.

The mounting region 16 is a region provided on the opposite side to the pixel region 12R in the Y direction with respect to the data line drive circuit 37 provided in the peripheral region 19, that is, a region provided outside the peripheral region 19. A plurality of mounting terminals 39 are provided in the mounting region 16. At least a video signal and a power supply voltage necessary to drive the plurality of pixels 11R of the electro-optical device 10R are input to the mounting terminal 39, for example, from an external circuit via a flexible flat cable wiring line (not illustrated).

Figure 3:
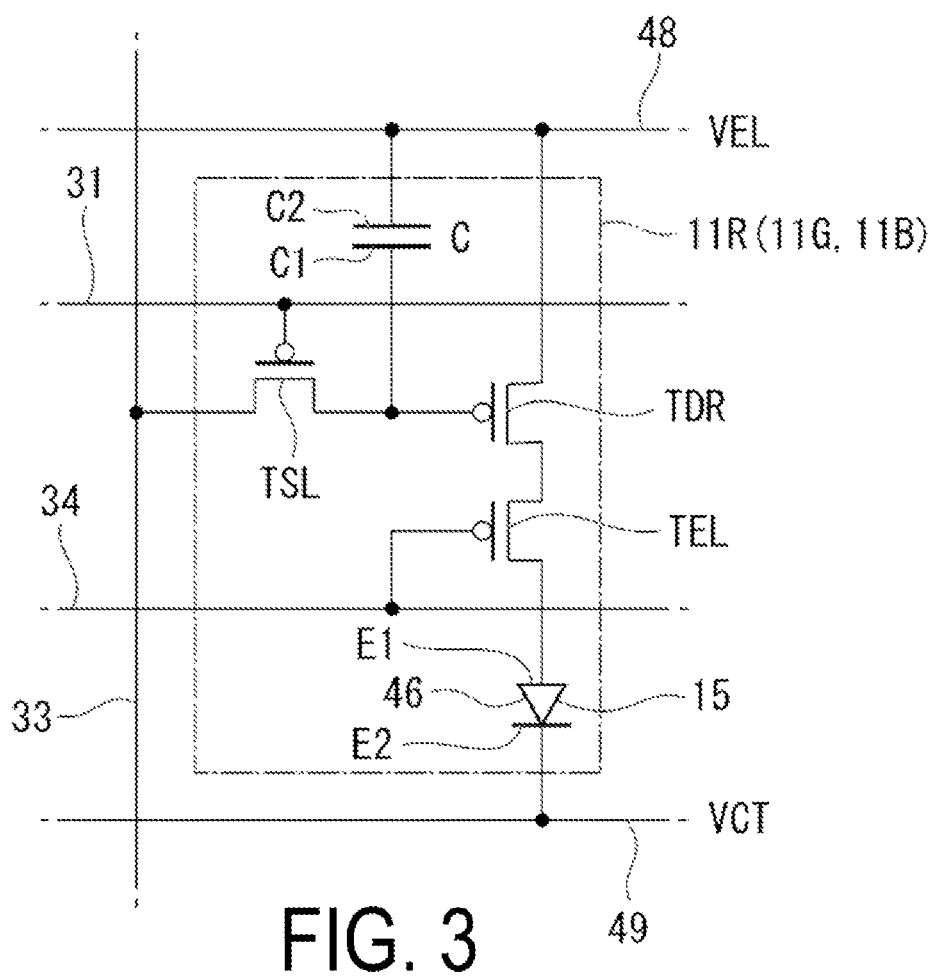
FIG. 3 is an equivalent circuit diagram of a pixel circuit included in each of pixels of the electro-optical device illustrated in FIG. 2.

FIG. 3 is an equivalent circuit diagram of the pixel circuit included in the pixel 11R. As illustrated in FIG. 3, the pixel 11R includes a light-emitting element 15, a drive transistor TDR, a light emission control transistor TEL, a selection transistor TSL, and a capacitance element C. Although the p-type drive transistor TDR, the p-type light emission control transistor TEL, and the p-type selection transistor TSL of the pixel 11R are illustrated as an example in FIG. 3, n-type transistors may be used in place of these p-type transistors.

The light-emitting element 15 is an organic EL element. A light-emitting layer 46 of the light-emitting element 15 is formed of an organic EL material, and is interposed between a first electrode E1 that is an anode, and a second electrode E2 that is a cathode. The first electrode E1 is formed individually for each of the pixels 11R, and the second electrode E2 is continuous across the plurality of pixels 11R. The light-emitting element 15 is disposed on a current path that couples a first power supply line 48 and a second power supply line 49. The first power supply line 48 is a power supply line to which a higher-side power supply potential VEL is supplied, and the second power supply line 49 is a power supply line to which a lower-side power supply potential VCT is supplied.

The drive transistor TDR and the light emission control transistor TEL are disposed on the current path that couples the first power supply line 48 and the second power supply line 49, in series with respect to the light-emitting element 15. Specifically, one of a pair of current terminals of the drive transistor TDR is coupled to the first power supply line 48, and constitutes one capacitance of source/drain capacitances. The one capacitance of the drive transistor TDR is, for example, the source capacitance. The other current terminal of the pair of current terminals of the drive transistor TDR is coupled to one current terminal of a pair of current terminals of the light emission control transistor TEL, and constitutes the other capacitance of the source/drain capacitances. The other capacitance of the drive transistor TDR is, for example, the drain capacitance.

The light emission control transistor TEL functions as a switch that controls a conductive state, that is, one of conductive/non-conductive states between the other capacitance of the drive transistor TDR and the first electrode E1 of the first light-emitting element 15. The drive transistor TDR generates a drive current of an amperage corresponding to the voltage between a gate and a source of the drive transistor TDR itself. In a state in which the light emission control transistor TEL is controlled to be in an ON state, the drive current is supplied from the drive transistor TDR to the light-emitting element 15 via the light emission control transistor TEL, and thus the light-emitting element 15 emits light at a luminance corresponding to the amperage of the drive current. In a state in which the light emission control transistor TEL is controlled to be in an OFF state, the supply of the drive current to the first light-emitting element 15 is cut off, and thus the light-emitting element 15 is extinguished. A gate of the light emission control transistor TEL is coupled to a control line 34.

The selection transistor TSL functions as a switch that controls a conductive state, that is, one of conductive/non-conductive states between the data line 33 and the gate of the drive transistor TDR. A gate of the selection transistor TSL is coupled to the scanning line 31. Further, the capacitance element C is an electrostatic capacitance with a dielectric substance interposed between a first electrode C1 and a second electrode C2. The first electrode C1 is coupled to the gate of the drive transistor TDR, and the second electrode C2 is coupled to the first power supply line 48, that is, the source of the drive transistor TDR. Thus, the capacitance element C holds the voltage between the gate and the source of the drive transistor TDR.

In the pixel circuit illustrated in FIGS. 2 and 3, the data line drive circuit 37 supplies a gradation potential corresponding to a gradation specified for each of the pixels 11R by an image signal supplied from an external circuit, to the plurality of signal lines 33 in parallel, for each writing period, that is, for each predetermined horizontal scanning period. By supplying a scanning signal to each of the scanning lines 31, the scanning line drive circuit 36 sequentially selects each of the plurality of scanning lines 31 for each writing period. The selection transistor TSL of the pixel 11R corresponding to the scanning line 31 selected by the scanning line drive circuit 36 transitions to the ON state. Thus, the gradation potential is supplied to the gate of the drive transistor TDR of each of the pixels 11R, via the data line 33 and the selection transistor TSL, and the voltage corresponding to the gradation potential is held in the capacitance element C. When the selection of the scanning line 31 in the writing period ends, each of the scanning line drive circuits 36 supplies a control signal to each of the control lines 34, thus controlling the light emission control transistor TEL of each of the pixels 11R corresponding to the control line 34 to be in the ON state. Thus, the drive current corresponding to the voltage held in the capacitance element C in the immediately preceding writing period is supplied to the light-emitting element 15 from the drive transistor TDR via the light emission control transistor TEL.

As described above, as a result of the light-emitting element 15 emitting the light at the luminance corresponding to the gradation potential, the desired image light LR specified by the image signal is emitted from a display region of the electro-optical device 10R. In other words, since the electro-optical device 10R has the above-described electrical configuration, the desired image light LR can be emitted using the plurality of light-emitting elements 15, without using a liquid crystal panel.

Figure 4:
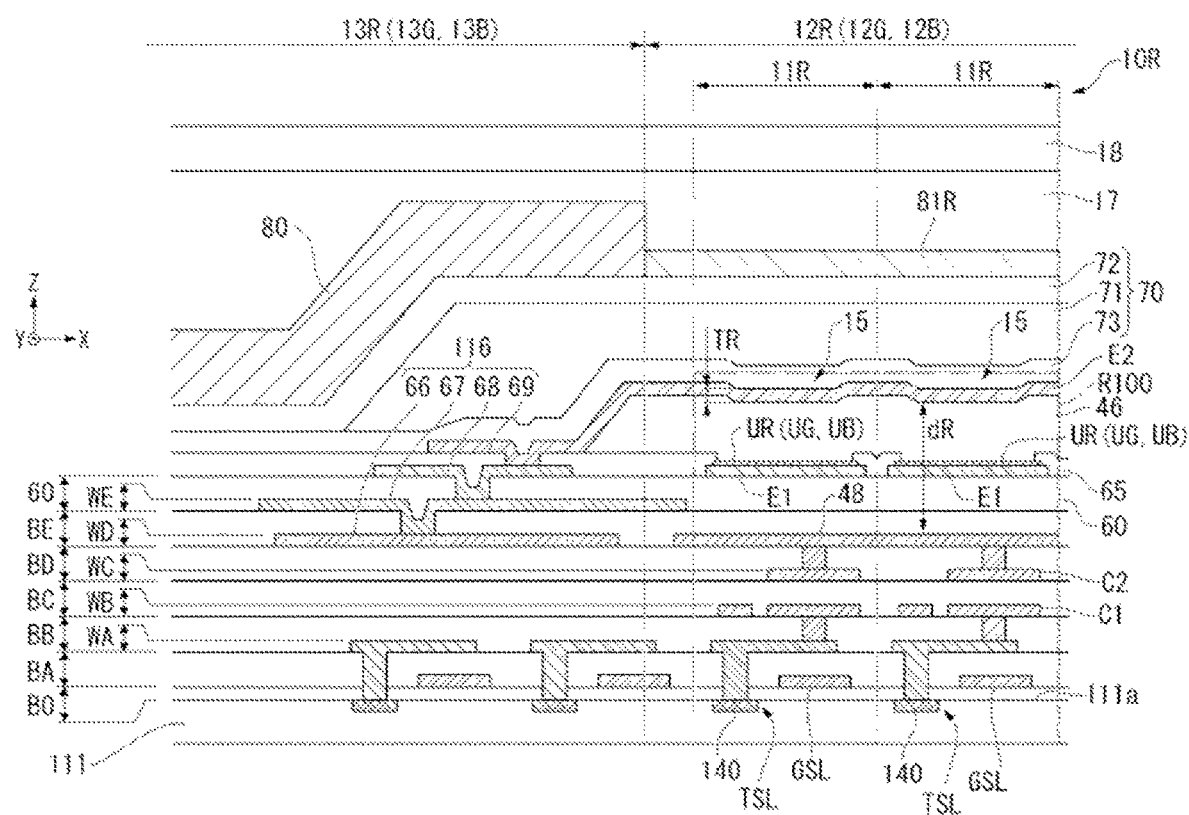
FIG. 4 is a cross-sectional view illustrating a configuration of the pixel circuit of the electro-optical device illustrated in FIG. 2.

FIG. 4 is a cross-sectional view illustrating the pixel circuit of the pixel 11R of the electro-optical device 10R. As illustrated in FIG. 4, an active region 140 of a transistor including the selection transistor TSL of the pixel 11R is formed on a substrate 111. The surface of the active region 140 is covered with a gate insulating film B0. The active region 140 means a source region or a drain region. Hereinafter, one direction orthogonal to the X direction and the Y direction will be referred to as a Z direction. A surface 111a of the substrate 111 is parallel to a plane including the X direction and the Y direction. The Z direction represents a direction away from the surface 111a, of directions orthogonal to the surface 111a. Further, a forward direction in the Z direction may be expressed as front or upper, and a rearward direction in the Z direction may be expressed as bottom or lower.

A gate electrode layer GSL is formed on the surface of the gate insulating film B0. A multilayer wiring layer in which a plurality of insulating layers BA to BE and a plurality of wiring layers WA to WE are alternately staked is formed on the upper layer side of the gate electrode layer GSL. Each of the wiring layers is formed of a low-resistance conductive material containing aluminum (Al) or gold (Au), for example.

The wiring layer WA including the scanning lines 31 illustrated in FIG. 3 is formed on the surface of the insulating layer BA. The wiring layer WB including the data lines 33 and the first electrodes C1 illustrated in FIG. 3 is formed on the upper layer side of the insulating layer BB. The wiring layer WC including the second electrodes C2 illustrated in FIG. 3 is formed on the upper layer side of the insulating layer BC. The wiring layer WD including the first power supply line 48 illustrated in FIG. 3 is formed on the upper layer side of the insulating layer BD. The wiring layer WE including wiring lines 67 and 69 is formed on the upper layer side of the insulating layer BE. Note that the substrate 14 of the electro-optical device 10R may be formed by the substrate 111, the gate insulating film B0, the gate electrode layer GSL, the insulating layers BA to BD, the wiring layers WA to WC, and the above-described components may be separately provided on the surface 14a of the substrate 14.

In a region where the plurality of pixels 11R of the pixel region 12R are arranged in the matrix pattern, an insulating layer 60 is formed on the upper layer side of the insulating layer BE. The insulating layer 60 is a layer that serves to set the resonance wavelength of an optical resonator to an appropriate wavelength, and is formed of a light-transmissive insulating material. The insulating material of the insulating layer 60 is, for example, silicon nitride (SiN) or silicon oxide (SiO2). The optical resonator is constituted in the Z direction by the first power supply line 48 as a reflective film, the insulating layer BE, the insulating layer 60, the first electrode E1 as a transparent electrode, and a conductive layer UR, the light-emitting layer 46, and the second electrode E2 as a semi-transmissive/semi-reflective electrode.

An optical path length dR between the surface of the first power supply line 48 and the bottom surface of the second electrode E2 in the above-described optical resonator is adjusted in accordance with the thickness of each of the insulating layer 60 and the first electrode E1. In the electro-optical device 10R, as a result of the red light being extracted from the second electrode E2, the resonance wavelength of the light emitted from the electro-optical device 10R is set. Specifically, since the red image light LR is emitted from the electro-optical device 10R, the optical path length dR of the optical resonator is set to an appropriate distance with respect to the red image light LR, while taking into account the red wavelength region.

The first electrode E1 is formed on the surface of the insulating layer 60 for each of the pixels 11R included in the pixel region 12R. The conductive layer UR is formed on the surface of each of the first electrodes E1. The first electrode E1 constitutes a transparent electrode, and is formed of a light-transmissive conductive material. The conductive material of the first electrode E1 is, for example, indium tin composite oxide (ITO), or indium zinc composite oxide (IZO). The conductive layer UR is formed of a light-transmissive conductive material. The conductive material of the conductive layer UR contains at least one of a nitride containing titanium (Ti), namely, titanium nitride (TiN), molybdenum (Mo), chromium (Cr), and nickel (Ni), for example. Note that it is sufficient that the insulating layer 60 be formed of the light-transmissive insulating material exemplified by SiN and SiO2, and the insulating layer 60 may be a single layer body containing these materials, or may be a stacked body.

Around the stacked structure of the first electrode E1 and the conductive layer UR in plan view, an insulating layer 65 is formed. In other words, an installation region of the first electrode E1 and the conductive layer UR, that is, the pixel 11R is defined by the insulating layer 65. The light-emitting layer 46 is formed on the surface of the conductive layer UR and the insulating layer 65. The light-emitting layer 46 is constituted by an organic layer including a light-emitting layer formed so as to contain an organic EL material that emits the red light, and the light-emitting layer 46 radiates, namely, emits the red light when the current is supplied thereto. Note that the light-emitting layer 46 may be formed by a stacked body in which a transport layer or an injection layer of electrons or positive holes supplied to the light-emitting layer is provided.

On the upper layer side of the light-emitting layer 46, the second electrode E2 as the semi-transmissive/semi-reflective electrode is formed over the entire region of the pixel region 12R. Of the light-emitting layer 46, a region sandwiched between the first electrode E1 and the second electrode E2 emits light as a light-emitting region. The second electrode E2 also functions as a semi-transmissive/semi-reflective layer that transmits some of the light that has reached the second electrode E2, and reflects at least some of the remaining light. The light-emitting layer 46 is formed of a light-reflective conductive material. The conductive material of the light-emitting layer 46 is, for example, a MgAg alloy containing silver (Ag) and magnesium (Mg). The thickness of the light-emitting layer 46 is sufficiently thin in consideration of the optical characteristics of the MgAg alloy, so that the light-emitting layer 46 can function as the semi-transmissive/semi-reflective electrode as described above.

In the non-pixel region 13R, metal wiring lines 116 including a plurality of wiring lines 66 to 69 are formed in the same layer as the conductive layer formed in the pixel region 12R. The wiring lines 66 to 69 are electrically coupled, for example, via a contact plug that is obtained by embedding a conductive material in a contact hole of an insulating layer formed between the wiring lines.

A sealing body 70 is formed on the upper layer side of the second electrode E2, over an entire in-plane region parallel to the surface 111a of the substrate 111. The sealing body 70 is a light-transmissive film body that prevents the infiltration of outside air and moisture by sealing each of the components formed on the surface 111a of the substrate 111. The sealing body 70 is constituted by a stacked film of a first sealing layer 71, a second sealing layer 72, and a third sealing layer 73. The third sealing layer 73 is formed on the upper layer side of the second electrode E2, and is in contact with the surface of the second electrode E2. The third sealing layer 73 is formed of an insulating inorganic material, for example. The third sealing layer 73 is formed of a compound of Si such as SiN or SiO2, for example. Further, the first sealing layer 71 functions as a flattening film that eliminates a step, that is, fills in a distance in the Z direction between the surfaces of the second electrode E2 and the third sealing layer 73. The first sealing layer 71 is formed of a light-transmissive organic material, such as an epoxy resin, for example. Further, the second sealing layer 72 is formed over the entire region of the substrate 111. The second sealing layer 72 is formed of silicon nitride or silicon oxynitride that offers excellent water-resistant and heat-resistant properties, for example.

On the surface of the second sealing layer 72 of the sealing body 70, a colored layer 81R is formed in the pixel region 12R, and a shielding layer 80 is formed in the non-pixel region 13R. The red light is allowed to transmit in the Z direction by the colored layer 81R in the pixel region 12R, and the red light is shielded in the Z direction by the shielding layer 80 in the non-pixel region 13R. In the electro-optical device 10R, a transmissive cover substrate 18 is fixed to the colored layer 81R and the shielding layer 80 by an adhesive 17, on the opposite side to the substrate 111 in the Z direction. With such a configuration, the colored layer 81R and the shielding layer 80 are protected by the cover substrate 18.

Figure 5:
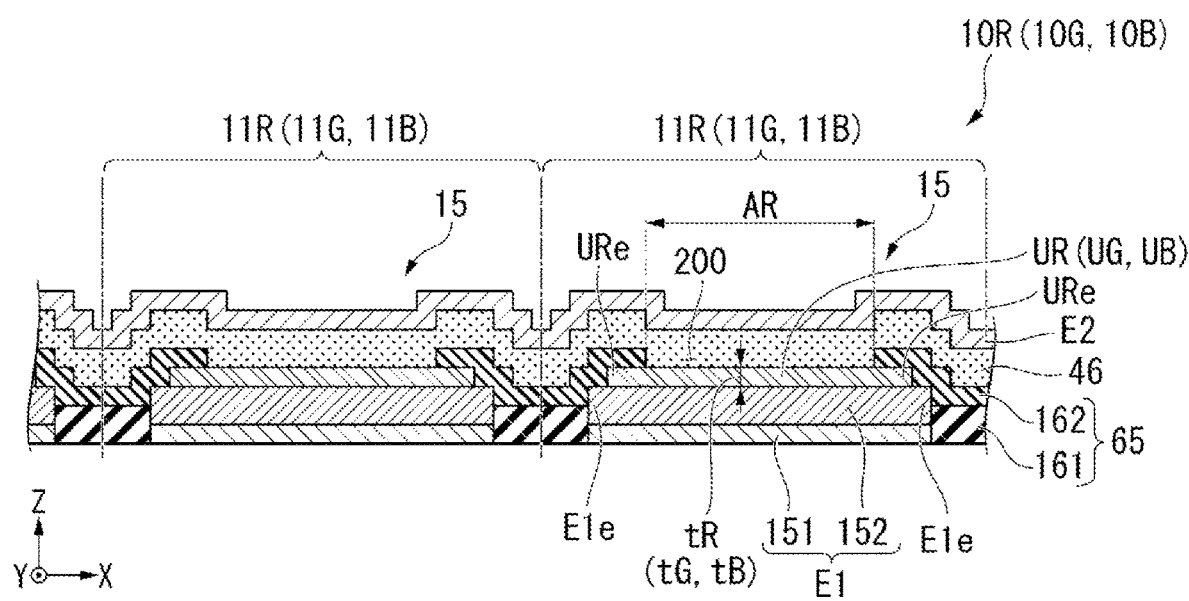
FIG. 5 is an enlarged view of the cross-sectional view of FIG. 4.

FIG. 5 is an enlarged view of a portion of the pixel circuit of the pixel 11R of the electro-optical device 10R, and is an enlarged view of a region R100 illustrated in FIG. 4. As illustrated in FIG. 5, the pixel circuit of the pixel 11R is constituted by an organic EL element in which the light-emitting layer 46 containing a red light-emitting material of the organic EL material is interposed between the first electrode E1 and the second electrode E2. In such an organic EL element, the first electrode E1 acts as an anode, and the second electrode E2 acts as a cathode.

Examples of the material of the first electrode E1 include ITO, IZO, and In3O3, SnO2, SnO2 containing Sb, oxides represented by ZnO containing Al, gold (Au), platinum (Pt), silver (Ag), copper (Cu), and alloys containing these elements. The first electrode may be formed of one of these materials, or may be formed of a combination of two or more of these materials. The first electrode E1 is, for example, a stacked body of a first conductive layer 151 and a second conductive layer 152 that are formed of the above-described material. The average thickness, that is, the average size in the Z direction of the first electrode E1 is preferably from 10 nm to 200 nm, and more preferably from 50 to 150 nm.

As the material of the conductive layer UR, as described above, at least one of TiN, Mo, Cr, and Ni is used, for example. The reflectance of the conductive layer UR with respect to the red light is lower than at least that of the first electrode E1. By providing the conductive layer UR having a lower reflectance than that of the first electrode E1 on the surface of the first electrode E1 having a high reflectance as described above, the light amount of the red light irradiated onto the first electrode E1 is adjusted, and the light amount of the red light irradiated onto the first electrode E1 is reduced at least compared to a case where the conductive layer UR is not provided.

Further, as a result of the conductive layer UR, which is formed of a material different from that of the first electrode E1, being provided to be in contact with the surface of the first electrode E1, degeneration of the first electrode E1 is suppressed. Note that when at least one of Mo, Cr, and Ni is used as the material of the conductive layer UR, in a production process of the conductive layer UR, a small amount of an oxide deriving from at least one of Mo, Cr, and Ni employed may be additionally formed.

The thickness of the conductive layer UR is preferably from 0.5 nm to 20 nm, for example. If the thickness of the conductive layer UR is less than 0.5 nm, the above-described effect obtained as a result of providing the conductive layer UR on the surface of the first electrode E1 is unlikely to be realized, and the effect is not expected. Further, if the thickness of the conductive layer UR exceeds 20 nm, the reflectance of the stacked body of the first electrode E1 and the conductive layer UR with respect to the red light decreases excessively, and there is a risk that the power consumption of the electro-optical device 10R may increase.

When viewed from the opposite direction along the Z direction in plan view, the insulating layer 65 is a stacked body of the first insulating layer 161 provided with no gap between the plurality of first electrodes E1, and a second insulating layer 162 provided on the surface of the first insulating layer 161. Each of the first insulating layer 161 and the second insulating layer 162 is formed of $SiO_2$, for example.

In the first embodiment, in plan view, the conductive layer UR is formed to be larger than a width AR and the area of an opening 200, which is defined by the second insulating layer 162 of the insulating layer 65 for each of the pixels 11R. Specifically, the first conductive layer 151 and the second conductive layer 152 of the first electrode E1 overlap with each other in plan view, and have the same size and shape as each other. The surface of the first insulating layer 161 of the insulating layer 65 is located lower than the surface of the second conductive layer 152 provided as the upper layer of the first electrode E1. An end portion URe of the conductive layer UR is located closer to the center than the end of the first electrode E1 in plan view. In other words, the conductive layer UR is formed to be smaller than the first electrode E1 in plan view. In plan view, the second insulating layer 162 of the insulating layer 65 is provided on the surface of the first insulating layer 161, the side surfaces and the surfaces of end portions of the second conductive layer 152 of the first electrode E1, and the surfaces of only the end portions URe of the conductive layer UR. In other words, in plan view, the end portions, that is, peripheral edge portions of the first electrode E1 and peripheral edge portions of the conductive layer UR are covered with the second insulating layer 162 of the insulating layer 65.

The thickness of the second insulating layer 162 of the insulating layer 65 is constant in the XY plane including the X direction and the Y direction. The height of the second insulating layer 162, that is, the position in the Z direction of the surface of the second insulating layer 162 changes in three stages, namely, from a height raised from the surface of the first insulating layer 161 by a constant thickness of the second insulating layer 162, to a height raised from the surface of the second conductive layer 152 by the constant thickness of the second insulating layer 162, and further to a height raised from the surface of the conductive layer UR by the constant thickness of the second insulating layer 162. The opening 200 is formed by a gap between the second insulating layers 162 in plan view.

The light-emitting layer 46 is provided on the surface of the second insulating layer 162 of the insulating layer 65 and on the surface of the conductive layer UR exposed to the opening 200. The thickness of the light-emitting layer 46 changes in the XY plane as appropriate, and is not constant. However, the height of the light-emitting layer 46, that is, the position in the Z direction of the surface of the light-emitting layer 46 changes in a plurality of stages in accordance with steps of the second insulating layer 162 of the insulating layer 65, and steps between the surface of an uppermost portion of the second insulating layer 162 and the surface of the conductive layer UR within the region of the opening 200. The light-emitting layer 46 is formed, for example, by a stacked body in which a hole injection layer, a hole transport layer, the red light-emitting layer, a hole blocking layer, an electron transport layer, and an electron injection layer (all of which are not illustrated) are sequentially stacked from the rear to the front in the Z direction.

Positive holes are injected into the hole injection layer of the light-emitting layer 46 from the first electrode E1. Examples of the material of the hole injection layer include an organic compound containing a cyano group, such as HAT-CN obtained by introducing a cyano group to a hexaazatriphenylene (HAT) derivative, which is a material of an organic n-type semiconductor.

The hole transport layer of the light-emitting layer 46 has a function of transporting positive the holes injected into the hole injection layer from the first electrode E1, which is the anode, to the red light-emitting layer. Examples of the material of the hole transport layer include an amine-based compound such as N,N,N',N'-tetraphenylbenzidine and derivatives thereof. The hole transport layer may be formed of one of these materials, or a combination of two or more of these materials.

The red light-emitting layer of the light-emitting layer 46 is formed, for example, including a red luminescent material that emits the red light and a host material that holds the red luminescent material. The red luminescent material may be one of various types of red fluorescent materials and red phosphorescent materials, or may be a material obtained by combining two or more of these materials. As the red fluorescent material, the material is not particularly limited as long as the material emits red fluorescent light, and examples of the material include perylene derivatives such as tetraaryldiindenoperylene derivatives, europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizine-9-yl)ethenyl)-4H-pyran-4H-ylidene)propanedinitrile (DCJTB), and 4-(dicyanomethylene)-2-methyl-6-(p-dimethylaminostyryl)-4H-pyran (DCM). As the red phosphorescent material, the material is not particularly limited as long as the material emits red phosphorescence light, and examples of the material include metal complexes represented by iridium (Ir), ruthenium (Ru), platinum (Pt), osmium (Os), rhenium (Re), and palladium (Pd), and also those metal complexes having at least one ligand having a phenylpyridine backbone, a bipyridyl backbone, a porphyrin backbone, or the like.

As the host material, the material is not particularly limited as long as it exhibits the above-described function with respect to the red luminescent material. When the red luminescent material includes the red fluorescent material, examples of the host material include anthracene derivatives represented by 2-t-butyl-9 and 10-di(2-naphthyl)anthracene (TBADN), acene derivatives (acene-based compounds) such as tetracene derivatives, distyrylarylene derivatives, perylene derivatives, distyrylbenzene derivatives, distyrylamine derivatives, quinolinolato metal complexes such as tris(8-quinolinolato)aluminum complex (Alq3), triarylamine derivatives such as a triphenylamine tetramer, oxadiazole derivatives, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi). Further, when the red luminescent material includes the red phosphorescent material, examples of the host material include carbazole derivatives such as 3-phenyl-4-(1-naphthyl)-5-phenylcarbazole and 4,4'-N,N'-dicarbazole biphenyl (CBP), and the like, and the host material may be formed of one of these materials, or a combination of two or more of these materials.

The material of the hole blocking layer of the light-emitting layer 46 is preferably an organic material with which an effect of blocking the upward movement of positive holes can be obtained, and the material is not particularly limited as long as the material is expected to exhibit the above-described effect.

The electron transport layer of the light-emitting layer 46 has a function of transporting electrons injected from the second electrode E2 via the electron injection layer to the red light-emitting layer. Examples of the constituent material of the electron transport layer include phenanthroline derivatives such as 2,9-dimethyl-4,7-diphenyl-1,10-phenanthroline (BCP), quinoline derivatives represented by organometallic complexes having 8-quinolinol or its derivative as ligands (for example, tris(8-quinolinolato)aluminum (Alq3)), azaindolizine derivatives, oxadiazole derivatives, perylene derivatives, pyridine derivatives, pyrimidine derivatives, quinoxaline derivatives, diphenylquinone derivatives, nitro-substituted fluorene derivatives, or the like. The electron transport layer may be formed of one of these materials, or a combination of two or more of these materials.

The electron injection layer of the light-emitting layer 46 has a function of improving the electron injection efficiency from the second electrode E2. Examples of the material of the electron injection layer include various types of inorganic insulating materials and inorganic semiconductor materials. Examples of the inorganic insulating material include alkali metal chalcogenides (oxides, sulfides, selenides, tellurides), alkaline earth metal chalcogenides, halides of alkali metal, halides of alkaline earth metal, or the like. The inorganic insulating material may be one of these materials, or may be a material obtained by combining two or more of these materials. By constituting the electron injection layer using the above-described material as the main material, electron injection characteristics can be improved. In particular, since the work function of the alkali metal compound including the alkali metal chalcogenide and the halide of alkali metal is extremely small compared to that of other materials, by constituting the electron injection layer using the alkali metal compound, the luminance of the light-emitting layer 46 can be increased. Examples of the inorganic semiconductor material include oxides, nitrides, or oxynitrides containing at least one element of lithium (Li), sodium (Na), barium (Ba), calcium (Ca), strontium (Sr), yttrium (Yb), Al, Ga, In, cadmium (Cd), Mg, Si, thallium (Ta), Sb, and zinc (Zn). The inorganic semiconductor material may be one of these materials, or may be a material obtained by combining two or more of these materials.

The second electrode E2 is an electrode that injects electrons into the electron transport layer via the electron injection layer. A material having a small work function is preferably used as the constituent material of the second electrode E2. Examples of the constituent material of the second electrode E2 include Li, Mg, Ca, Sr, lanthanum (La), cerium (Ce), Er, Eu, Sc, Y, Yb, Ag, Cu, Al, cesium (Cs), Rb, and alloys containing these elements. The second electrode E2 may be formed of one of these materials, or may be a stacked body having a plurality of layers formed by a combination of two or more of these materials.

Similarly to the electro-optical device 10R described above, each of the electro-optical device 10G and the electro-optical device 10B illustrated in FIG. 1 has the electrical structure described in FIGS. 3 to 5. Although not illustrated, the electro-optical device 10G includes the light-emitting layer 46 including a green light-emitting layer formed so as to contain an organic EL material that emits the green light including the green wavelength region, in place of the red light-emitting layer of the plurality of light-emitting elements 15 illustrated in each of FIGS. 3 and 5.

The green light-emitting layer includes a green luminescent material that emits the green light and a host material that holds the green luminescent material. The green luminescent material is not limited to a specific material. The green luminescent material may be one of various types of green fluorescent materials and green phosphorescent materials, or may be a material obtained by combining two or more of these materials.

The green luminescent material is not particularly limited as long as the material emits green luminescent light, and examples of the material include quinacridones and its derivatives such as coumarin derivatives and quinacridone derivatives, 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], poly[(9,9-dioctyl-2,7-divinylenefluorenylene)-alt-co-(2-methoxy-5-(2-ethoxylhexyloxy)-1,4-phenylene)], and the like. The green luminescent material may be one of these materials, or may be a material obtained by combining two to more of these materials.

Further, the green phosphorescent material is not particularly limited as long as the material emits green phosphorescence light, and examples of the green phosphorescent material include metal complexes of one of Ir, Ru, Pt, Os, Re and Pd. Among those, as the green phosphorescent material, the metal complexes having at least one ligand having the phenylpyridine backbone, the bipyridyl backbone, or the porphyrin backbone are preferable. More specifically, the green phosphorescent material may be fac-tris (2-phenylpyridine)iridium (Ir(ppm)3), bis(2-phenylpyridinate-N, C2')iridium (acetylacetonate), or fac-tris[5-fluoro-2-(5-trifluoromethyl-2-pyridine)phenyl-C,N] iridium.

As the host material that holds the green luminescent material, a similar material to the host material of the red luminescent material described above can be used, but the host material of the green luminescent material is preferably an acene-based compound.

Further, although not illustrated, in the electro-optical device 10G, a colored layer 81G is formed in place of the colored layer 81R of the electro-optical device 10R described above with reference to FIGS. 4 and 5. The colored layer 81G selectively allows the transmission of the green light of the green wavelength region. Further, in the electro-optical device 10G, the thicknesses of the insulating layer 60 and the first electrode E1 illustrated in FIGS. 4 and 5 are adjusted in accordance with the wavelength of the green image light LG emitted from the electro-optical device 10G. In an optical resonator of the electro-optical device 10G, an optical path length dG between the surface of the first power supply line 48 that functions as a reflective film and the bottom surface of the second electrode E2 that functions as a semi-transmissive/semi-reflective electrode is optimized in accordance with the wavelength of the image light LG. Further, in the pixel circuit of the electro-optical device 10G, the width, the opening area, and the plan view shape of the opening 200 of each of the plurality of pixels 11G are the same as the width, the opening area, and the plan view shape of the opening 200 of each of the plurality of pixels 11R of the pixel circuit of the electro-optical device 10R.

Further, the electro-optical device 10B includes the light-emitting layer 46 including a blue light-emitting layer formed so as to contain an organic EL material that emits the blue light including the blue wavelength region, in place of the red light-emitting layer of the plurality of light-emitting elements 15 illustrated in both FIGS. 3 and 5.

The blue light-emitting layer includes a blue luminescent material that emits the blue light and a host material that holds the blue luminescent material. The blue luminescent material is not limited to a specific material. The blue luminescent material may be one of various types of blue fluorescent materials and blue phosphorescent materials, or may be a material obtained by combining two or more of these materials.

The blue luminescent material is not particularly limited as long as the material emits blue luminescent light, and examples of the material include distyrylamine derivatives such as distyryldiamine-based compounds, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly[(9,9-dihexyloxyfluorene-2,7-diyl)-alt-co-(2-methoxy-5-{2-ethoxyhexyloxy}phenylene-1,4-diyl)], and poly[(9,9-dioctylfluorene-2,7-diyl)-co-(ethylnylbenzene)]. The blue luminescent material may be one of these materials, or may be a material obtained by combining two or more of these materials.

The blue phosphorescent material is not particularly limited as long as the material emits blue phosphorescence light, and examples of the blue phosphorescent material include metal complexes of one of Ir, Ru, Pt, Os, Re and Pd. Specifically, the blue phosphorescent material may be bis [4,6-difluorophenyl pyridinate-N,C2']-picolinate-iridium, tris[2-(2,4-difluorophenyl)pyridinate-N,C2'] iridium, bis [2-(3,5-trifluoromethyl)pyridinate-N, c2"]-picolinate-iridium, or bis (4,6-difluorophenyl pyridinate-N,C2')iridium (acetylacetonate).

As the host material that holds the blue luminescent material, a similar material to the host material of the red luminescent material described above can be used, but the host material of the blue luminescent material is preferably an acene-based compound.

Further, although not illustrated, in the electro-optical device 10B, a colored layer 81B is formed in place of the colored layer 81R of the electro-optical device 10R described above with reference to FIGS. 4 and 5. The colored layer 81B selectively allows the transmission of the blue light of the blue wavelength region. Further, in the electro-optical device 10B, the thicknesses of the insulating layer 60 and the first electrode E1 illustrated in FIGS. 4 and 5 are adjusted in accordance with the wavelength of the blue image light LB emitted from the electro-optical device 10B. In an optical resonator of the electro-optical device 10B, an optical path length dB between the surface of the first power supply line 48 that functions as the reflective film and the bottom surface of the second electrode E2 that functions as the semi-transmissive/semi-reflective electrode is optimized in accordance with the wavelength of the image light LG and the color purity or the color gamut of the image light LG. Further, in the pixel circuit of the electro-optical device 10B, the width, the opening area, and the plan view shape of the opening 200 of each of the plurality of pixels 11B are the same as the width, the opening area, and the plan view shape of the opening 200 of each of the plurality of pixels 11R, 11G of the pixel circuits of the electro-optical devices 10R, 10G.

In the electro-optical devices 10R, 10G, 10B, the optical path lengths dR, dB, dG between the first power supply line 48 and the second electrode E2 are adjusted to optimal lengths, respectively. Thus, between the first power supply line 48 and the second electrode E2, the image light LR having a peak in the red wavelength region is generated by the electro-optical device 10R, the image light LG having a peak in the green wavelength region is generated by the electro-optical device 10G, and the image light LB having a peak in the blue wavelength region is generated by the electro-optical device 10B.

Further, the thickness of the second electrode E2 of the electro-optical device 10B is preferably equal to or less than the thickness of the second electrode E2 of the electro-optical device 10G. The thickness of the second electrode E2 of the electro-optical device 10R is preferably equal to or less than the thickness of the second electrode E2 of the electro-optical device 10B. By setting the thicknesses of the second electrode E2 in this manner, the light emission luminance by the electro-optical device 10B can be efficiently obtained. Further, by setting the thicknesses of the second electrode E2 as described above, the area ratio of a region over which regions respectively surrounded by red, green, and blue overlap each other when the chromaticity of each of the image light LR, LG, LB is replaced with coordinates, can be maintained to be high, and the light emission luminance of the optical modulation device 1 can be increased compared to a case where the thicknesses of the second electrode E2 are not set optimally.

When the thicknesses of the second electrode E2 are set to satisfy the above-described relationship in the three electro-optical devices 10R, 10G, 10B, the thickness of the second electrode E2 of each of the electro-optical devices 10R, 10G, 10B is preferably from 10 nm to 40 nm. Further, when the main material of the second electrode E2 included in each of the three electro-optical devices 10R, 10G, 10B is a MgAg alloy, the ratio of Mg and Ag is preferably from 1:7 to 1:13, for example. With these above-described configurations, both the above-described effect regarding the light emission luminance by the electro-optical device 10B, and the light emission luminance of the optical modulation device 1 can be further enhanced.

Furthermore, although not illustrated, in the electro-optical device 10G, a conductive layer UG is formed in place of the conductive layer UR of the electro-optical device 10R described above with reference to FIGS. 4 and 5. In the electro-optical device 10B, a conductive layer UB is formed in place of the conductive layer UR of the electro-optical device 10R described above with reference to FIGS. 4 and 5. For example, a material similar to that of the conductive layer UR can be used as the material of each of the conductive layers UG and UB. In the three electro-optical devices 10R, 10G, 10B, when the reflectance for the red light, the green light, and the blue light irradiated per unit thickness of each of the conductive layers UR, UG, UB is equal to each other and lower than that of the first electrode E1 of each of the electro-optical devices 10R, 10G, 10B, at least a thickness tB of the conductive layer UB of the electro-optical device 10B is thinner than thicknesses tG, tR of the conductive layers UG, UR of the electro-optical devices 10G, 10R. For example, the conductive layers UR, UG, UB of the three electro-optical devices 10R, 10G, 10B are formed of the same material as each other. Further, a luminance half-value period, which represents lifetime characteristics and a driving deterioration, relating to emission of the blue light by the light-emitting layer 46 of the electro-optical device 10B is shorter than the luminance half-value periods for irradiation of the green light and of the red light by the light-emitting layers 46 of the electro-optical devices 10G, 10R. Thus, when the electro-optical devices 10R, 10G, 10B are used for the same period of time, the luminance of the blue light emitted from the light-emitting layer 46 of the electro-optical device 10B deteriorates further than the luminance of each of the green light and the red light emitted from the light-emitting layers 46 of the electro-optical devices 10G, 10R. As a result, there is a greater deterioration in the luminance of the image light LB compared to that in the luminance of the image light LG and LR, and a color shift notably occurs.

As a result of the conductive layers UR, UG, UB being provided on the surfaces of the first electrodes E1 of the electro-optical devices 10R, 10G, 10B, and the thickness tB of the conductive layer UB of the electro-optical device 10B being thinner than each of the thicknesses tG, tR of the conductive layers UG, UR of the electro-optical devices 10G, 10R, the light amount ratio of the blue light reflected by the first electrode E1 and transmitted through the conductive layer UB, with respect to the blue light emitted from the light-emitting layer 46 of the electro-optical device 10B is higher than the light amount ratios of the green light and the red light reflected by the first electrode E1 and transmitted through the conductive layers UG, UR, respectively, with respect to the green light and the red light emitted from the light-emitting layers 46 of the electro-optical devices 10G, 10R, respectively. Thus, the deterioration rate of the luminance of the image light LR, LG, LB with respect to the driving time becomes substantially the same as each other.

Further, when each of the conditions described above is satisfied, the luminance half-value period for the emission of the green light by the light-emitting layer 46 of the electro-optical device 10G may become shorter than the luminance half-value period for the irradiation of the red light by the light-emitting layer 46 of the electro-optical device 10R. In this case, when the electro-optical devices 10R, 10G are used for the same period of time, the luminance of the green light emitted from the light-emitting layer 46 of the electro-optical device 10G deteriorates further than the luminance of the red light emitted from the light-emitting layer 46 of the electro-optical device 10R. As a result, there is a greater deterioration in the luminance of the image light LG compared to that in the luminance of the image light LR, and the color shift occurs. Thus, when the luminance half-value period for the light-emitting layer 46 of the electro-optical device 10G is shorter than the luminance half-value period for the electro-optical device 10R, the thickness tG of the conductive layer UG of the electro-optical device 10G is preferably thinner than the thickness tR of the conductive layer UR of the electro-optical device 10R. As a result, the light amount ratio of the green light reflected by the first electrode E1 and transmitted through the conductive layer UG, with respect to the green light emitted from the light-emitting layer 46 of the electro-optical device 10G becomes higher than the light amount ratio of the red light reflected by the first electrode E1 and transmitted through the conductive layer UR, with respect to the red light emitted from the light-emitting layer 46 of the electro-optical device 10R Thus, the deterioration rate of the luminance of the image light LR, LG, LB with respect to the driving time becomes substantially the same as each other.

Next, an example of characteristics of each of the electro-optical devices 10R, 10G, 10B having the above-described configuration will be described. It is assumed that, in the electro-optical devices 10R, 10G, 10B, the same type of materials are selected from the materials exemplified in the above description as the materials for each of the first electrode E1, the conductive layers UR, UG, UB, the insulating layer 65, and the second electrode E2, which are the main components of the pixel circuit illustrated in FIG. 5. Further, it is assumed that, in the electro-optical devices 10R, 10G, 10B, also with respect to the light-emitting layer 46 of the pixel circuit, a material is appropriately selected from the materials exemplified in the above description in accordance with each of the color light, the luminance half-value period for the light-emitting layers of each color of the light-emitting layer 46 of the electro-optical device 10R is 600 hours, the luminance half-value period for the light-emitting layer 46 of the electro-optical device 10G is 400 hours, and the luminance half-value period for the light-emitting layer 46 of the electro-optical device 10B is 300 hours. Furthermore, it is assumed that TiN is selected as the material of the conductive layers UR, UG, UB.

Using each of the materials and the conditions described above, each of the thicknesses tR, tG, tB of the conductive layers UR, UG, UB of the electro-optical devices 10R, 10G, 10B are changed in accordance with numerical examples 1 to 7. In each of the numerical examples 1 to 7, calculations are made for the luminance of white light and color coordinates (x,y) of the white light in the xy chromaticity diagram at a time of initial driving, for the luminance of the white light and the color coordinates (x,y) of the white light in the xy chromaticity diagram at a time when 300 hours elapsed from the time of the initial driving, and for Δu'v'. Calculation results are shown in Table 1. The Δu'v' represents a distance between the color coordinates of the white light in the uv chromaticity diagram at the time of initial driving, and the color coordinates of the white light in the uv chromaticity diagram at the time when 300 hours elapsed from the time of the initial driving. When Δu'v' is 0.02 or greater, it is considered that an observer perceives and visually recognizes a color shift.

device 10G. As a result, the balance of the luminance of the image light LR, LG, LB did not change significantly from the balance at the time of initial driving, and Δu'v' was suppressed to be less than 0.02. From the results shown in the numerical examples 1 to 3, it was confirmed that, as a result of the thin conductive layers UR, UG, UB being provided on the surface of the first electrodes E1, the shorter the luminance half-value period, which represents the lifetime characteristics and the driving deterioration of the light-emitting layers of each color of the light-emitting layer 46, the more effectively the luminance of the image light from the electro-optical device including the light-emitting layer having a longer luminance half-value period was suppressed to be close to the luminance of the image light from the electro-optical device including the light-emitting layer having a shorter luminance half-value period, even when a certain time period elapsed from the time of the initial driving. Further, it was confirmed that Δu'v' of the white light obtained by synthesizing the image light LR, LG, LB was suppressed to be less than 0.02.

Further, in the numerical example 1, a difference between the thicknesses tR, tG and a difference between the thicknesses tG, tB of the conductive layers UR, UG, UB of the electro-optical devices 10R, 10G, 10B are equal to each other, and the differences are larger than those in the numerical examples 2 and 3. Further, in the numerical example 2, the difference between the thicknesses tR, tG and the difference between the thicknesses tG, tB of the conductive layers UR, UG, UB of the electro-optical devices

TABLE 1

|  | THICK-NESS tR [nm] | THICK-NESS tG [nm] | THICK-NESS tB [nm] | AT TIME OF INITIAL DRIVING | | WHEN 300 HOURS ELAPSED FROM TIME OF INITIAL DRIVING | | |
|---|---|---|---|---|---|---|---|---|
|  |  |  |  | LUMINANCE [cd/m$^2$] | COLOR CORDINATES (x, y) | LUMINANCE [cd/m$^2$] | COLOR CORDINATES (x, y) | Δ u' v' |
| EXAMPLE 1 | 12 | 8 | 4 | 3605 | (0.310, 0.310) | 1883 | (0.314, 0.315) | 0.004 |
| EXAMPLE 2 | 10 | 8 | 4 | 3607 |  | 1945 | (0.327, 0.314) | 0.012 |
| EXAMPLE 3 | 8 | 6 | 4 | 3620 |  | 2109 | (0.335, 0.324) | 0.017 |
| EXAMPLE 4 | 10 | 10 | 4 | 3607 |  | 1793 | (0.330, 0.300) | 0.019 |
| EXAMPLE 5 | 4 | 4 | 4 | 3623 |  | 2282 | (0.350, 0.329) | 0.027 |
| EXAMPLE 6 | 6 | 6 | 6 | 3032 |  | 2077 | (0.353, 0.341) | 0.029 |
| EXAMPLE 7 | 10 | 12 | 4 | 3619 |  | 1583 | (0.332, 0.279) | 0.034 |

As shown in Table 1, in the numerical examples 1 to 3, the thicknesses tR, tG, tB of the conductive layers UR, UG, UB of the electro-optical devices 10R, 10G, 10B get gradually thinner, that is, at least the thickness tB is thinner than the thicknesses tG, tR, and the thickness tG is thinner than the thickness tR. Thus, at the time when 300 hours elapsed from the time of the initial driving, the luminance of the red image light LR and the green image light LG respectively emitted from the electro-optical devices 10R, 10G was suppressed so as not to become significantly higher than the luminance of the blue image light LB emitted from the electro-optical device 10B, and the balance of the luminance of the image light LR, LG, LB did not change significantly from the balance at the time of initial driving. As a result, Δu'v' was suppressed to be less than 0.02. Further, in the numerical examples 1 to 3, since the thickness tG of the conductive layer UG of the electro-optical device 10G was thinner than the thickness tR of the conductive layer UR of the electro-optical device 10R, the luminance of the red image light LR emitted from the electro-optical device 10R was suppressed so as not to become significantly higher than the luminance of the green image light LG emitted from the electro-optical 10R, 10G, 10B are equal to each other, and the differences are larger than those in the numerical example 3. From the results shown in the numerical examples 1 to 3, it was confirmed that, as the luminance half-value period of each of the light-emitting layers of each color of the light-emitting layer 46 became shorter, and then the differences between the thicknesses tR, tG, tB of the conductive layers UR, UG, UB became greater with the thin conductive layers UR, UG, UB provided on the surface of the first electrodes E1, the more effectively Δu'v' could be reduced.

Further, in the numerical example 4, the thicknesses tR, tG of the conductive layers UR, UG of the electro-optical devices 10R, 10G are equal to each other, and are thicker than the thickness tB of the conductive layer UB of the electro-optical device 10B. In this case also, Δu'v' was suppressed to be less than 0.02. From the results shown in the numerical example 4, it was confirmed that when at least the thickness tB of the conductive layer UB of the electro-optical device 10B provided with the light-emitting layer 46 including the blue light-emitting layer having the shortest luminance half-value period was thinner than the thicknesses tG, tR of the conductive layers UG, UR of the other electro-optical devices 10G, 10R, Δu'v' could be reduced even when a certain time period elapsed from the time of the initial driving.

On the other hand, in the numerical examples 5 and 6, even though there is a difference between the luminance half-value periods of the light-emitting layers of each color of the light-emitting layer 46, the thicknesses tR, tG, tB of the conductive layers UR, UG, UB of the electro-optical devices 10R, 10G, 10B are equal to each other. In this case, the luminance of the red image light LR emitted from the electro-optical device 10R became higher than the luminance of the green image light LG emitted from the electro-optical device 10G, and the luminance of the green image light LG emitted from the electro-optical device 10G became higher than the luminance of the blue image light LB emitted from the electro-optical device 10B. As a result, a luminance difference between the image light LR and the image light LB was increased, and Δu'v' reached a value of 0.02 or greater, for example, when 300 hours elapsed from the time of the initial driving. Thus, there is a risk that the observer may visually recognize the color shift.

Furthermore, in the numerical example 7, although the thickness tB of the conductive layer UB of the electro-optical device 10B provided with the light-emitting layer 46 including the blue light-emitting layer having the shortest luminance half-value period is thinner than both of the thicknesses tG, tR of the conductive layers UG, UR of the other electro-optical devices 10G, 10R, the thickness tG of the conductive layer UG of the electro-optical device 10G, in which the luminance half-value period for the green light-emitting layer of the light-emitting layer 46 is shorter than that for the red light-emitting layer of the light-emitting layer 46, is thicker than the thickness tR of the conductive layer UR of the electro-optical device 10R. As a result, the luminance differences between the image light LR, LG, LB were increased, and the color balance was further reduced. For example, when 300 hours elapsed from the time of the initial driving, the luminance of the white light obtained by synthesizing the image light LR, LG, LB was further reduced compared to the other numerical examples, while Δu'v' was further increased compared to the other numerical examples, reaching a value of 0.02 or greater. Thus, there is a risk that the observer may clearly visually perceive the color shift.

Next, an example of a manufacturing method of the main components of the pixel circuit illustrated in FIG. 5 of the electro-optical device 10R described above will be briefly described. Although not illustrated, the conductive material of the first conductive layer 151, the conductive material of the second conductive layer 152, and the conductive material of the conductive layer UR are stacked on the surface of the insulating layer 60, which is flattened to be parallel to the XY plane of the pixel region 12R, so that each of the conductive layers has a predetermined thickness, as illustrated in FIG. 4. Subsequently, for example, of the stacked body obtained by stacking the respective conductive materials of the first conductive layer 151, the second conductive layer 152, and the conductive layer UR, a stacked body corresponding to a region in plan view where the plurality of pixels 11R are to be formed is kept, a stacked body outside the region where the plurality of pixels 11R are to be formed is removed, and the surface of the insulating layer 60 is exposed once again. Further, of the stacked body, peripheral edge portions of the layer formed by the conductive material of the conductive layer UR are removed, and the conductive layer UR that is smaller than the first electrode E1 in plan view is formed on the surface of the second conductive layer 152 of the first electrode E1.

Subsequently, the insulating material of the first insulating layer 161 of the insulating layer 65 is formed so as to cover the side surfaces and the surfaces of the peripheral edge portions of the second conductive layer 152 in plan view at the end portions thereof in plan view, the surface of the conductive layer UR, and the surface of the exposed insulating layer 60. Thereafter, the insulating material of the first insulating layer 161 is recessed downward, that is, rearward in the Z direction, and the surface of the insulating material is caused to be lower than the surface of the second conductive layer 152 of the first electrode E1. At this point, an upper portion in the Z direction of the second conductive layer 152, the end portions, that is, the peripheral edge portions of the second conductive layer 152 in plan view, and the conductive layer UR are exposed. Subsequently, the second insulating layer 162 of the insulating layer 65 is formed so as to cover the surface of the first insulating layer 161, the surface and upper portions of the side surfaces of the exposed second conductive layer 152, and the surface of the conductive layer UR. Thereafter, in a region corresponding to each of the plurality of pixels 11R, the opening 200, of each of the second conductive layers 152, having the width AR in plan view is formed, and the surface of the conductive layer UR is exposed at the bottom of the opening 200.

Subsequently, the materials of each of the hole injection layer, the hole transport layer, the red light-emitting layer, the hole blocking layer, the electron transport layer, and the electron injection layer constituting the light-emitting layer 46 are sequentially stacked so as to cover the surface of the second conductive layer 152 and the surface of the exposed conductive layer UR, in order to form the light-emitting layer 46. Thereafter, the conductive material of the second electrode E2 is provided on the surface of the light-emitting layer 46, and the second electrode E2 is formed. By performing each of the steps described above, the main components of the pixel region 12R of the pixel circuit of the electro-optical device 10R illustrated in FIG. 5 can be manufactured. Note that the manufacturing method described above is an example, and the manufacturing method of the main components of the pixel area 12R of the pixel circuit of the electro-optical device 10R illustrated in FIG. 5 is not necessarily limited to the above-described method.

Further, a manufacturing method of each of the main components of the pixel regions 12G, 12B of the pixel circuits of the electro-optical devices 10G, 10B, that is, the main components corresponding to the configuration illustrated in FIG. 5 in each of the electro-optical devices 10G, 10B is the same as the above-described manufacturing method of the main components of the pixel circuit of the electro-optical device 10R. However, in the manufacturing method of each of the main components of the pixel regions 12G, 12B of the electro-optical devices 10G, 10B, the thicknesses of the conductive materials constituting the conductive layers UG, UB are adjusted so that, when the conductive layers UG, UB are formed in place of the conductive layer UR, the above-described relationship between the thicknesses tR, tG, tB is satisfied, namely, the thickness tB becomes thinner than both the thicknesses tG, tR.

Figure 6:
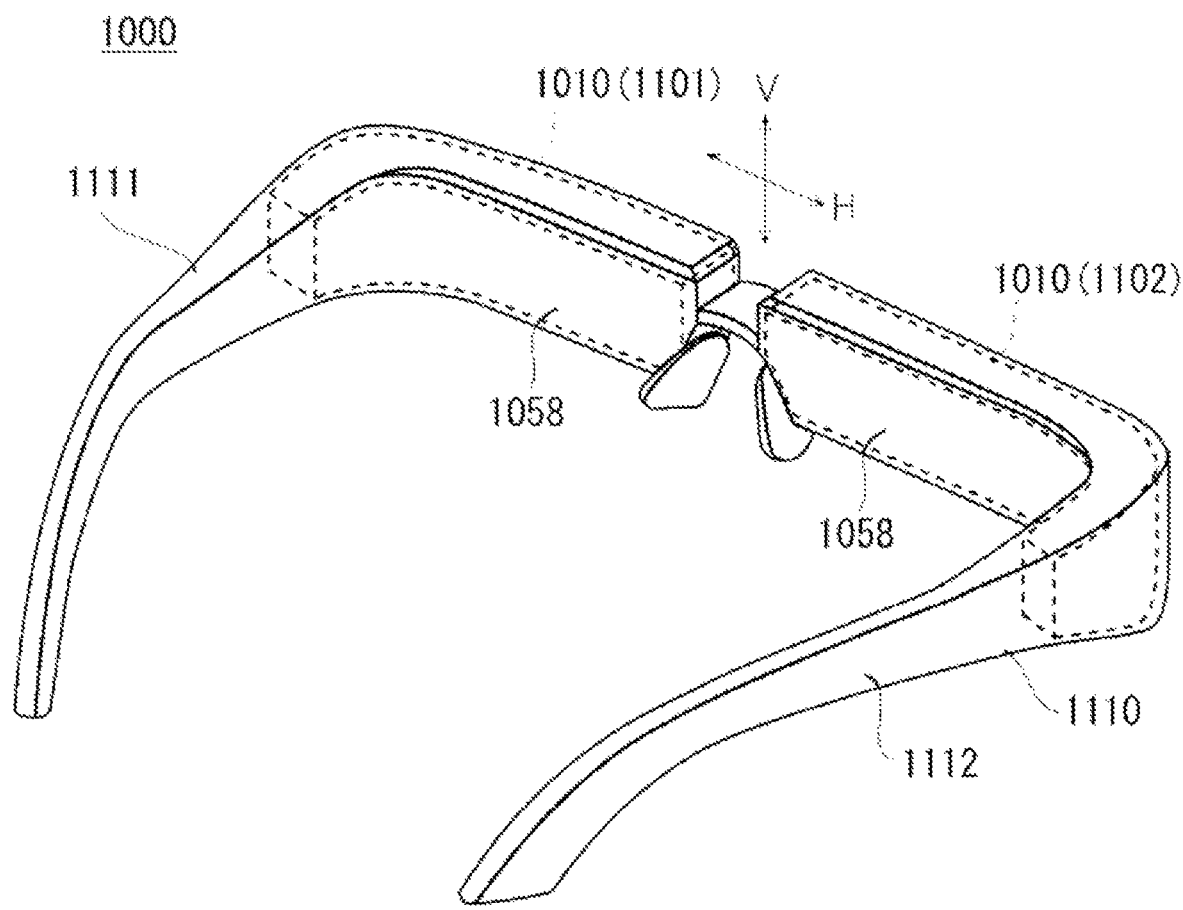
FIG. 6 is a perspective view illustrating a configuration of a display device according to the first embodiment.

FIG. 6 is a schematic view illustrating a configuration of a head-mounted display 1000, which is a virtual image display device including the optical modulation device 1 according to the first embodiment. The head-mounted display 1000 is configured as a see-through eyeglass display, and includes a frame 1110 provided with left and right temples 1111, 1112. Virtual image display units 1010 are supported by the frame 1110, and an image emitted from the virtual image display units 1010 is caused to be recognized as a virtual image by a user (not illustrated).

Figure 7:
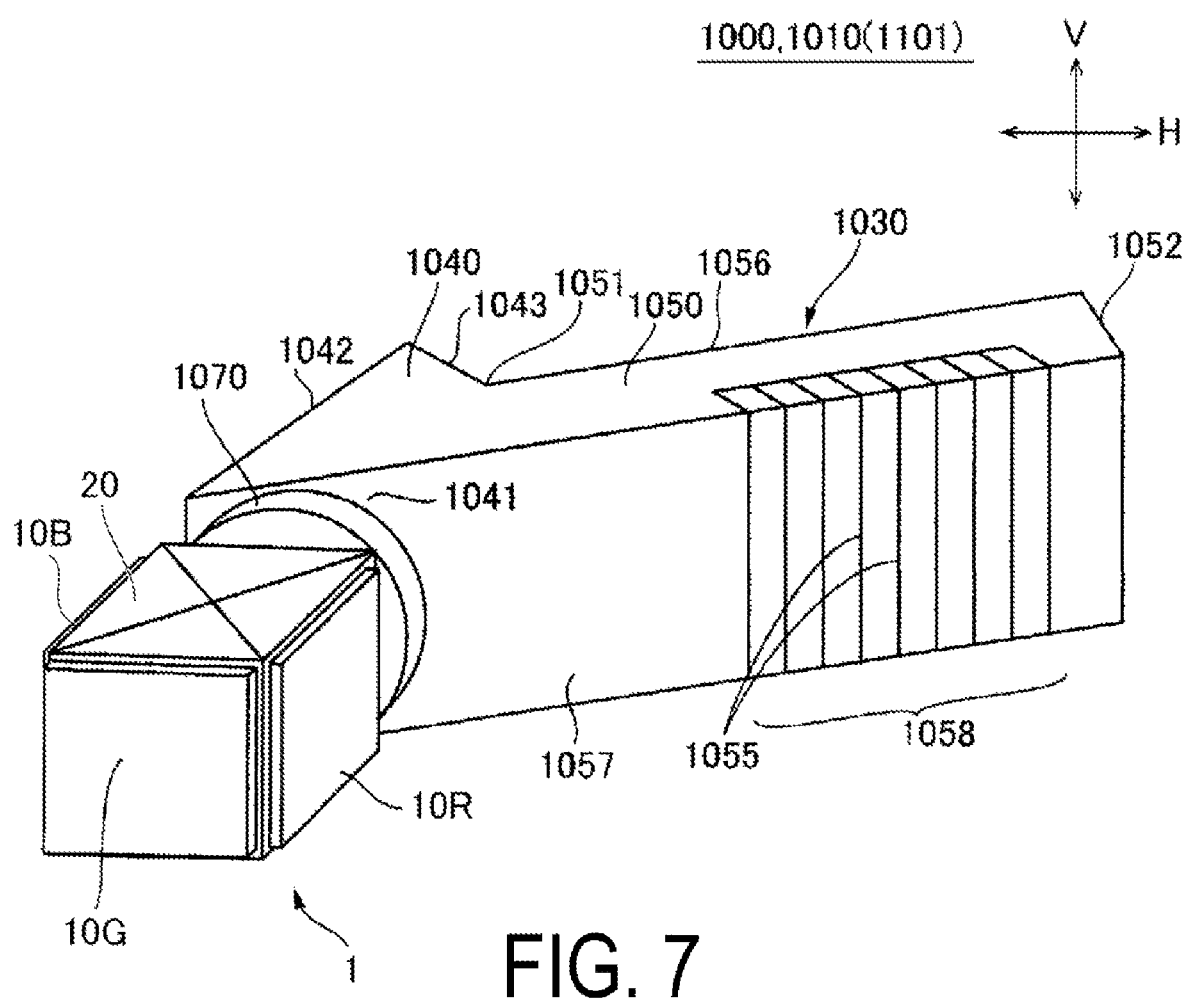
FIG. 7 is a schematic view illustrating an optical system of a virtual image display unit of the image display device illustrated in FIG. 6.
Figure 8:
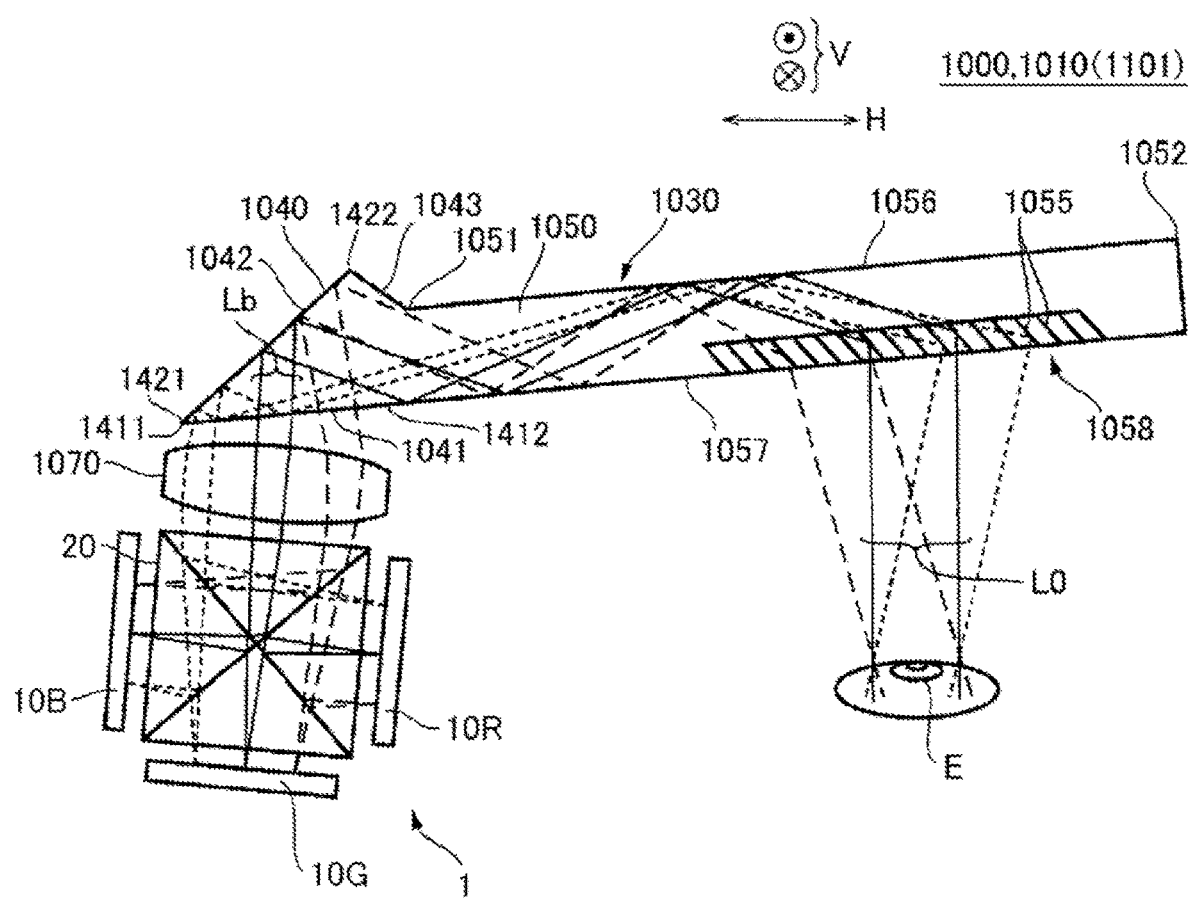
FIG. 8 is a diagram for describing optical paths of the optical system illustrated in FIG. 7.

The head-mounted display 1000 is provided with a left-eye display unit 1101 and a right-eye display unit 1102 as the virtual display units 1010. The left-eye display unit 1101 and the right-eye display unit 1102 have the same configuration and are disposed left-right symmetrically. FIG. 7 is a perspective view illustrating a configuration of an optical system of the virtual image display unit 1010. FIG. 8 is a schematic view illustrating optical paths of the optical system illustrated in FIG. 7, and is a view when viewed from a direction orthogonal to the surface of a light-guiding portion 1050. As illustrated in FIGS. 7 and 8, the left-eye display unit 1101 includes the above-described optical modulation device 1, and a light-guiding system 1030 that guides the synthesized image light LW emitted from the optical modulation device 1. A projection lens system 1070 is disposed between the optical modulation device 1 and the light-guiding system 1030. The synthesized image light LW emitted from the optical modulation device 1 is incident on the light-guiding system 1030 via the projection lens system 1070. The projection lens system 1070 is constituted by a single collimate lens that has a positive power.

The light-guiding system 1030 includes a transmissive incidence portion 1040 on which the synthesized image light LW is incident, and the transmissive light-guiding portion 1050 having one end 1051 coupled to the incidence portion 1040. The incidence portion 1040 and the light-guiding portion 1050 are constituted by an integrated transmissive member.

A reflection film is not formed on an incident surface 1041. However, the incident surface 1041 has optical transparency and light reflectivity, and fully reflects light that is incident at an incident angle equal to or greater than a critical angle. A reflective surface 1042 faces the incident surface 1041. One end 1422 of the reflective surface 1042 is separated further from the incident surface 1041 than another end 1421 of the reflecting surface 1042 is. Thus, the incidence portion 1040 has a substantially triangular shape. The reflection surface 1042 includes a flat surface, an aspherical surface, or a free form surface. The reflective surface 1042 is constituted by a reflective metal layer including, for example, Al, Ag, Mg, or Cr as the main component.

The light-guiding portion 1050 includes a first surface 1056 that extends from one end 1051 toward another end 1052, a second surface 1057 that faces the first surface 1056 in a parallel manner and extends from the one end 1051 toward the other end 1052, and an emitting portion 1058 provided on a portion, of the second surface 1057, that is separated from the incidence portion 1040. The first surface 1056 and the reflection surface 1042 of the incidence portion 1040 are continuous via an inclined surface 1043. A gap between the first surface 1056 and the second surface 1057 is thinner than the thickness of the incident portion 1040. The first surface 1056 and the second surface 1057 fully reflect the light that is incident at an incident angle equal to or greater than the critical angle, based on a refractive index difference between the light-guiding portion 1050 and the outside air. Thus, the reflection film is not formed on the first surface 1056 and the second surface 1057.

The emitting portion 1058 is constituted on a portion of the light-guiding portion 1050, on the second surface 1057 side in the thickness direction. In the emitting portion 1058, a plurality of partial reflection surfaces 1055, which are inclined with respect to a direction orthogonal to the second surface 1057, are arranged to be parallel to each other. The emitting portion 1058 is a portion, of the second surface 1057, that overlaps with the plurality of partial reflection surfaces 1055, and has a predetermined width in an extending direction of the light-guiding portion 1050. Each of the plurality of partial reflection surfaces 1055 is constituted by a dielectric multilayer film. Further, at least one of the plurality of partial reflection surfaces 1055 may be a composite layer including a dielectric multilayer film, and a reflective metal layer mainly formed of at least one of Al, Ag, Mg, and Cr. When the partial reflection surface 1055 includes the metal layer, it is possible to obtain an effect of enhancing the reflectance of the partial reflection surface 1055, or possible to optimize the incident angle dependence or the polarization dependence of the transmittance and the reflectance of the partial reflection surface 1055. Note that the emitting portion 1058 may be provided with an optical element including a diffraction grating and a hologram.

In the head-mounted display 1000 having the above-described configuration, the synthesized light LW formed by parallel light entering from the incidence portion 1040 is refracted on the incident surface 1041, and propagates toward the reflection surface 1042. The synthesized light LW is reflected on the reflection surface 1042, and propagates toward the incident surface 1041 again. At this time, since the synthesized light LW is incident on the incident surface 1041 at an incident angle equal to or greater than the critical angle, the synthesized light LW is reflected by the incident surface 1041 toward the light-guiding unit 1050, and propagates toward the light-guiding unit 1050. Note that, in the incidence portion 1040, each of the incident surface 1041 and the reflection surface 1042 may be constituted by a free form curve, and after the synthesized light LW, which is non-parallel light, enters the incident surface 1041, the synthesized light LW may be converted into the parallel light while being reflected between the reflection surface 1042 and the incident surface 1041.

In the light-guiding unit 1050, the synthesized light LW advances while being reflected between the first surface 1056 and the second surface 1057. Then, a part of the synthesized light LW incident on the partial reflection surface 1055 is reflected on the partial reflection surface 1055, and is emitted from the emitting portion 1058 toward an eye E of the observer. Further, at least a part of the rest of the synthesized light LW incident on the partial reflection surface 1055 passes through the partial reflection surface 1055, and enters the next adjacent partial reflection surface 1055. Thus, the synthesized light LW, which is reflected on each of the plurality of partial reflection surfaces 1055, is emitted from the emitting portion 1058 toward the eye E of the observer. As a result, the observer can recognize a virtual image. At this time, the light enters the light-guiding portion 1050 from the outside, then passes through the partial reflection surfaces 1055, and reaches the eye E of the observer. Thus, the observer can visually recognize a color image emitted from the optical modulation device 1, and can visually recognize the scenery of the outside world in a so-called see-through manner.

The optical modulation device 1 according to the first embodiment described above includes the electro-optical device (first electro-optical device) 10R, the electro-optical device (second electro-optical device) 10G, and the electro-optical device (third electro-optical device) 10B, and the dichroic prism (prism) 20. The electro-optical device 10R includes the light-emitting element (first light-emitting element) 15 including the light-emitting layer 46 that emits the red light (light) including the red wavelength region. The electro-optical device 10G includes the light-emitting element (second light-emitting element) 15 including the light-emitting layer 46 that emits the green light (light) including the green wavelength region. The electro-optical device 10B includes the light-emitting element (third light-emitting element) 15 including the light-emitting layer 46 that emits the blue light (light) including the blue wavelength region. The dichroic prism 20 synthesizes the image light (light) LR, LG, LB respectively emitted from the electro-optical device 10R, the electro-optical device 10G, and the electro-optical device 10B. Each of the light-emitting elements 15 of the electro-optical devices 10R, 10G, 10B includes the first electrode E1 that acts as the anode, the second electrode E2 that acts as the cathode, and the conductive layer UR, UG, or UB. Each of the conductive layers UR, UG, UB is provided between the first electrode E1 and the light-emitting layer 46, and has a lower reflectance than that of the first electrode E1 with respect to the color light (light) corresponding to one of the electro-optical devices 10R, 10G, 10B among the red light, the green light, and the blue light emitted from the light-emitting layer 46. In the optical modulation device 1 according to the first embodiment, the thickness tB of the conductive layer UB of the electro-optical device 10B is thinner than the thickness tR of the conductive layer UR of the electro-optical device 10R and the thickness tG of the conductive layer UG of the electro-optical device 10G.

In the optical modulating device 1 according to the first embodiment, the thickness tB of the conductive layer UB of the electro-optical device 10B including the blue light-emitting layer 46, for which it is considered that the lifetime characteristics are shorter and the deterioration rate is faster compared to the red and green light-emitting layers 46, is changed with respect to the thicknesses tG, tR of the conductive layers UG, UR of the other electro-optical devices 10G, 10R, and the thickness tB is thinner than the thicknesses tG, tR. According to the optical modulation device 1 of the first embodiment, even after a certain time period elapsed from the time of the initial driving, it is possible to suppress the color shift of the synthesized image light LW obtained by synthesizing the image light LR, LG, LB, namely, the white light by aligning the luminance of the image light LG, LR emitted from each of the electro-optical devices 10G, 10R with the luminance of the image light LB emitted from the electro-optical device 10B, which has the worst lifetime characteristics and deterioration rate among the three electro-optical devices 10R, 10G, 10B. As a result, the quality of the optical modulation device 1 can be maintained to be high.

In order to suppress the color shift of the synthesized image light or the white light in the optical modulation device, as a method of adjusting the light emission efficiency of the light-emitting layer 46 of the light-emitting element 15, for example, a method of changing the material of the electron transport layer of the light-emitting layer 46, or a method of changing conditions used at a time of adjusting the material of the light-emitting layer 46 or the electron transport layer is known. However, in these methods, it is extremely difficult to finely adjust the material to be used from among a countless number of organic materials, or to adjust the conditions used at a granular level. Thus, it is difficult to obtain an intended light emission efficiency.

According to the optical modulation device 1 of the first embodiment, the luminance of the image light LR, LG, LB respectively emitted from the electro-optical devices 10R, 10G, 10B, which have different light emission efficiencies from each other due to their lifetime characteristics and the time elapsed from the time of the initial driving, can be optically adjusted. Thus, the luminance of the image light LR, LG, LB can be easily and accurately calculated on the basis of physical property values including the refractive index and the extinction coefficient of the material of each of the components of the pixel circuit, as illustrated in the numerical examples 1 to 7 described above.

Al and Ag, which are applicable to the first electrodes E1 of the electro-optical devices 10R, 10G, 10B described above, are materials having a high reflectance among the metals. When the conductive layer UR, UG, or UR, which may act as a barrier layer, is provided on the surface of the first electrode E1, the reflectance of the first electrode E1 with respect to the color light emitted from the light-emitting layer 46 is reduced. However, the light amount of the color light, which is reflected and emitted by the stacked body formed by the first electrode E1 and the conductive layer UR, UG, or UB, correlates to each of the thicknesses tR, tG, tB of the conductive layers UR, UG, UB, and the thicker the thickness tR, tG, or tB, the lower the light amount of color light. According to the optical modulation device 1 of the first embodiment, the thicknesses tR, tG, tB can be adjusted in accordance with the lifetime characteristics, the deterioration rate, and the luminance half-value period of the light-emitting layer 46 of each of the electro-optical devices 10R, 10G, 10B, for example, and by adjusting each of the thicknesses tR, tG, tB to become thinner as the deterioration rate thereof becomes faster and the luminance half-value period thereof becomes shorter, it is possible to suppress the color shift of the synthesized image light LW, that is, the white light.

In the optical modulating device 1 according to the first embodiment, each of the electro-optical devices 10R, 10G, 10B has the layered structure along the Z direction as described above, and constitutes a so-called top-emission element. Thus, the color light emitted from the light-emitting layer 46 is repeatedly reflected between the first electrode E1 and the second electrode E2. Therefore, the color light having a high color purity can be efficiently extracted from each of the electro-optical devices 10R, 10G, 10B.

Further, in the optical modulation device 1 according to the first embodiment, the thickness tR of the conductive layer UR of the light-emitting element 15 of the electro-optical device 10R is equal to or thicker than the thickness tG of the conductive layer UG of the light-emitting element 15 of the electro-optical device 10G. Further, the thickness tG of the conductive layer UG of the light-emitting element 15 of the electro-optical device 10G is thicker than the thickness tB of the conductive layer UB of the light-emitting element 15 of the electro-optical device 10B. In the optical modulation device 1 according to the first embodiment, the thickness tG of the conductive layer UG of the electro-optical device 10G including the green light-emitting layer 46, which is considered to have shorter lifetime characteristics and a faster deterioration rate than the red light-emitting layer 46, is changed with respect to the thickness tR of the conductive layer UR of the electro-optical device 10R, and the thickness tG is thinner than the thickness tR. According to the optical modulation device 1 of the first embodiment, even after a certain time period elapsed from the time of the initial driving, by aligning the luminance of the image light LR emitted from the electro-optical device 10R with the luminance of the image light LG emitted from the electro-optical device 10G, which is inferior to the electro-optical device 10R in terms of the lifetime characteristics and the deterioration rate of the light emitting layer 46, the color shift of the synthesized image light LW obtained by synthesizing the image light LR, LG, LB, that is, the white light can be further suppressed. As a result, the quality of the optical modulation device 1 can be maintained to be high.

Further, in the optical modulation device 1 according to the first embodiment, each of the electro-optical device 10R, the electro-optical device 10G, and the electro-optical device 10B includes the insulating layer 65 between the first electrode E1 and the light-emitting layer 46. In the electro-optical device 10R, the insulating layer 65 is provided so as to cover end portions E1e of the first electrode E1 in plan view, and the end portions URe of the conductive layer UR in plan view. In each of the electro-optical devices 10G, 10B also, the insulating layer 65 can be disposed with respect to the first electrode E1 and the conductive layers UG, UB in the same manner as in the electro-optical device 10R. According to the optical modulation device 1 of the first embodiment, since the end portions E1e of the first electrode E1 and the end portions URe of the conductive layer UR are covered with the insulating layer 65 in plan view, the first electrode E1 and the conductive layer UR within the range of the opening 200 can be reliably irradiated with the color light emitted from the light-emitting layer 46. According to the optical modulation device 1 of the first embodiment, the color light reflected by the first electrode E1 is favorably emitted from the opening 200, and as a result, color light having a desired luminance distribution corresponding to the width AR, the area, and the shape of the opening 200 can be extracted from each of the electro-optical devices 10R, 10G, 10B.

Further, in the optical modulating device 1 according to the first embodiment, the area of the opening 200 formed by the insulating layer 65 of each of the electro-optical devices 10R, 10G, 10B is equal to each other. In the optical modulation device 1 according to the first embodiment, the plurality of pixels 11B of the electro-optical device 10B face the incident surface 21 of the dichroic prism 20, the plurality of pixels 11G of the electro-optical device 10G face the incident surface 22 of the dichroic prism 20, and the plurality of pixels 11R of the electro-optical device 10R face the incident surface 23 of the dichroic prism 20. The image light LR, LG, LB respectively formed by the red light, the green light, the blue light emitted from the plurality of pixels 11R, 11G, 11B is synthesized with each other by the first dichroic mirror 25 and the second dichroic mirror 26. Thus, it is important that the three electro-optical devices 10R, 10G, 10B are disposed so as to be aligned without displacement with the incident surfaces 23, 22, 21, respectively, for synthesizing the image light LR, LG, LB. In particular, with the miniaturization of each of the pixels 11R, 11G, 11B, the accuracy required for the alignment of the electro-optical devices 10R, 10G, 10B with respect to the incident surfaces 23, 22, 21 increases. According to the optical modulation device 1 of the first embodiment, the sizes of the pixels 11R, 11G, 11B, which are determined in accordance with the area of the opening 200 of each of the electro-optical devices 10R, 10G, 10B, are aligned with each other, and thus, the alignment of the electro-optical devices 10R, 10G, 10B with respect to the incident surfaces 23, 22, 21 can be easily performed. As a result, the synthesized image light LW with little color bleeding can be generated.

When the sizes of the plurality of pixels 11R, 11G, 11B of the electro-optical devices 10R, 10G, 10B are equal to each other as in the optical modulation device 1 according to the first embodiment, a method of controlling the lifetime characteristics of the light-emitting layer 46 of each of the electro-optical devices 10R, 10G, 10B using a duty ratio of an electrical signal supplied to the pixel circuit, namely, by modulating a ratio between a light-on period and a light-off period is known. However, when the duty ratio is shifted from a predetermined value, there is a risk that flickers or flickering in the image formed by the image light LR, LG, LB may occur. Further, when it is necessary to individually supply electrical signals having mutually different duty ratios to the electro-optical devices 10R, 10G, 10B, the configuration and operation of a control device of the electro-optical devices 10R, 10G, 10B become complex. According to the optical modulation device 1 of the first embodiment, the duty ratios of the electrical signals supplied to the pixel circuits of the electro-optical devices 10R, 10G, 10B are set to be the same as each other, and thus the configuration and operation of the control device of the electro-optical devices 10R, 10G, 10B can be simplified.

Further, in the optical modulation device 1 according to the first embodiment, the thickness of each of the conductive layers UR, UG, UB is from 0.5 nm to 20 nm. According to the optical modulation device 1 of the first embodiment, the luminance of the reflected light of the color light from the first electrode E1 can be appropriately suppressed in accordance with the element lifetime of the light-emitting layer 46 as described above, and thus an excessive increase in the power consumption of the electro-optical devices 10R, 10G, 10B can be avoided.

Further, in the optical modulation device 1 according to the first embodiment, the material constituting the conductive layers UR, UG, UB includes at least one of Mo, Cr, Ni, or a nitride containing Ti. Typically, Al, Ag, or an alloy of these metals, which is inexpensive and has a high corrosion resistance, is used as the material of the first electrode E1. On the other hand, with Al, Ag, and the alloy of these metals, the fact that a natural oxide film is formed on the surface thereof simply as a result of being exposed to the atmosphere, and also the fact that the contact resistance thereof at the surface is high are recognized as issues. If the contact resistance of the surface of the first electrode E1 is high, the positive holes cannot be injected into the hole injection layer of the light-emitting layer 46 of the first electrode E1. According to the optical modulation device 1 of the first embodiment, since each of the conductive layers UR, UG, UB is formed on a portion, of the first electrode E1, that is irradiated with the color light without being exposed to the atmosphere after the formation of the first electrode E1, namely, on the surface of the first electrode E1 within the range of the opening 200 in plan view, an increase in the contact resistance of the first electrode E1 that is irradiated with the color light can be suppressed. As a result, the injection and transport of the positive holes in the light-emitting layer 46 of each of the electro-optical devices 10R, 10G, 10B can be favorably promoted, and the quality of the optical modulation device 1 can be maintained to be high.

Note that, in the pixel circuit of each of the electro-optical devices 10R, 10G, 10B of the optical modulation device 1 described above, for example, the first electrode E1 in the configuration of the main components illustrated in FIG. 5 need not necessarily have the two-layer structure constituted by the first conductive layer 151 and the second conductive layer 152, and may be constituted by one conductive layer. Similarly, the insulating layer 65 need not necessarily have the two-layer structure constituted by the first insulating layer 161 and the second insulating layer 162, and may be constituted by one insulating layer.

Further, in the configuration of the main components of the pixel circuit of each of the electro-optical devices 10R, 10G, 10B illustrated in FIG. 5, the sizes and shapes of the conductive layers UR, UG, UV may be the same as those of the first electrode E1.

The head-mounted display (display device) 1000 according to the first embodiment includes the optical modulation device 1 described above, and the projection lens system (optical system) 1070 and the light-guiding system (optical system) 1030 for displaying the synthesized image light (light) LW emitted from the optical modulation device 1. According to the head-mounted display 1000 of the first embodiment, even after a certain time period elapsed from the time of the initial driving, the color shift of the image to be observed can be suppressed, and a high quality can be maintained.

Second Embodiment

Next, a second embodiment of the present disclosure will be described with reference to FIG. 9.

Note that, in the second embodiment, configurations common with the first embodiment will be denoted by the same reference signs, and descriptions thereof will be omitted. In the second embodiment, configurations or matters different from those of the first embodiment will be mainly described. Further, an optical modulation device and a display device according to the second embodiment are obtained by replacing the electro-optical devices 10G, 10B, and 10R in each of the optical modulation device 1 and the head-mounted display 1000 described in the first embodiment, with electro-optical devices to be described below.

A pixel circuit of the pixel 11R of the electro-optical device 10R according to the second embodiment has a similar configuration to that of the pixel circuit of the pixel 11R according to the first embodiment. FIG. 9 is an enlarged view of a portion of the pixel circuit of the pixel 11R of the electro-optical device 10R according to the second embodiment, and corresponds to the enlarged view of the region R100 illustrated in FIG. 4.

Figure 9:
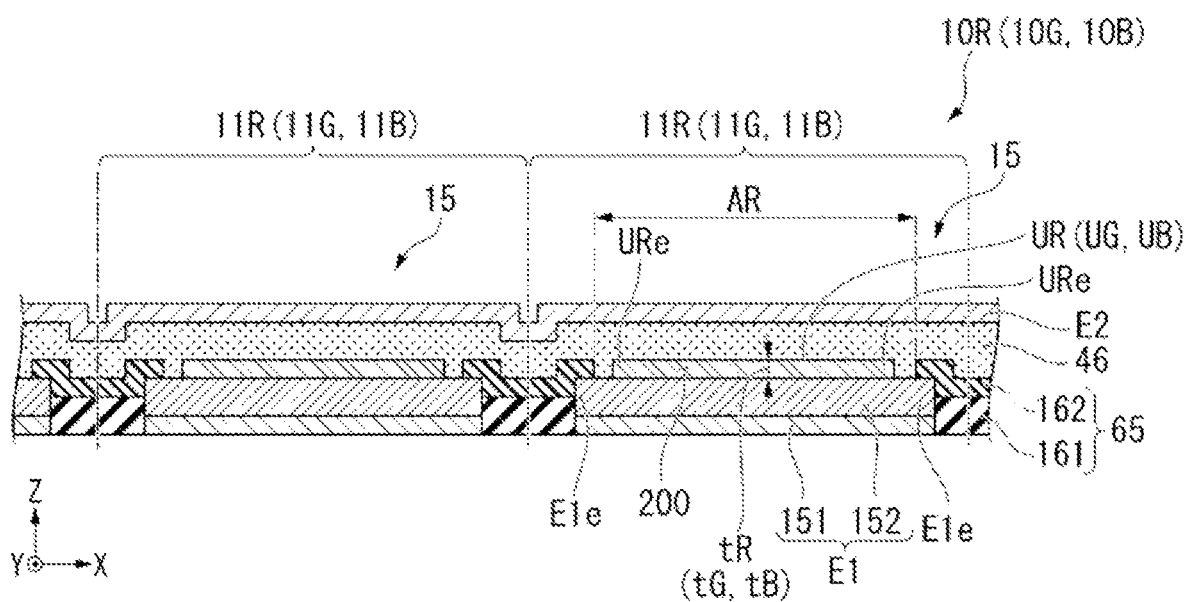
FIG. 9 is a cross-sectional view illustrating a configuration of the pixel circuit of the electro-optical device in the optical modulation device according to a second embodiment.

As illustrated in FIG. 9, in the pixel circuit of the pixel 11G of the electro-optical device 10G according to the second embodiment, in plan view, the conductive layer UR is formed to be smaller than the width AR and the area of the opening 200, which is defined by the second insulating layer 162 of the insulating layer 65 for each of the pixels 11R. Specifically, in plan view, the second insulating layer 162 of the insulating layer 65 is provided on the surface of the first insulating layer 161 and the side surfaces and the surface of the second conductive layer 152 of the first electrode E1. In other words, the end portions, that is, the peripheral edge portions of the first electrode E1 in plan view are covered with the second insulating layer 162 of the insulating layer 65. On the other hand, unlike the first embodiment, in plan view, the conductive layer UR is not covered with the second insulating layer 162 of the insulating layer 65.

The thickness of the second insulating layer 162 of the insulating layer 65 is constant in the XY plane including the X direction and the Y direction. The height of the second insulating layer 162, that is, the position in the Z direction of the surface of the second insulating layer 162 changes in two stages in total, namely, from the height raised from the surface of the first insulating layer 161 by the constant thickness of the second insulating layer 162, to the height raised from the surface of the second conductive layer 152 by the constant thickness of the second insulating layer 162. The opening 200 is formed by the gap between the second insulating layers 162 in plan view, and there is a gap between the peripheral edge of the second insulating layer 162 of the insulating layer 65, and the peripheral edge of the conductive layer UR. In the pixel circuit of the pixel 11G of the electro-optical device 10G according to the second embodiment, in plan view, the light-emitting layer 46 is interposed between the peripheral edge of the second insulating layer 162 and the peripheral edge of the conductive layer UR.

The light-emitting layer 46 is provided on the surface of the second insulating layer 162 of the insulating layer 65, on the surface of the conductive layer UR exposed to the opening 200, and between the insulating layer 65 and the conductive layer UR.

A manufacturing method of the electro-optical device 10R according to the second embodiment is generally similar to the manufacturing method of the electro-optical device 10R according to the first embodiment. However, when forming the opening 200, the conductive layer UR is not exposed to the bottom of the opening 200 but to the opening 200, and a portion of the surface of the second conductive layer 152 is exposed to the bottom of the opening 200. In other words, the width AR of the opening 200 is set to be greater than the width of the conductive layer UR in the XY plane.

Subsequently, the materials of each of the hole injection layer, the hole transport layer, the red light-emitting layer, the hole blocking layer, the electron transport layer, and the electron injection layer constituting the light-emitting layer 46 are sequentially stacked so as to cover the surface of the exposed second conductive layer 152 and the surface and the side surfaces of the conductive layer UR to form the light-emitting layer 46. Thereafter, the conductive material of the second electrode E2 is provided on the surface of the light-emitting layer 46, and the second electrode E2 is formed. By performing each of the steps described above, the main components of the pixel region 12R of the pixel circuit of the electro-optical device 10R illustrated in FIG. 9 can be manufactured.

Note that the manufacturing method described above is an example, and the manufacturing method of the main components of the pixel area 12R of the pixel circuit of the electro-optical device 10R according to the second embodiment illustrated in FIG. 9 is not necessarily limited to the above-described method. For example, in the second embodiment, first, the first electrode E1 for each of the plurality of pixels 11R is formed on the surface of the insulating layer 60 in a similar manner as in the manufacturing method described above, and then, the insulating material of the first insulating layer 161 may be formed on the surface of the insulating layer 60 and the surface of the second conductive layer 152. Thereafter, in a similar manner as in the manufacturing method described above, the first insulating layer 161 may be recessed, and the insulating material of the second insulating layer 162 may be formed on the surface of the first insulating layer 161 and the surface and the side surfaces of the exposed second conductive layer 152 to form the opening 200. Then, the conductive layer UR may be formed at the opening 200 so as to be smaller than the opening 200 in plan view with a gap between the conductive layer UR and the end of the second insulating layer 162 constituting the edge of the opening 200.

Further, a manufacturing method of each of the main components of the pixel regions 12G, 12B of the pixel circuit of each of the electro-optical devices 10G, 10B according to the second embodiment, that is, a manufacturing method of the main components corresponding to the configuration illustrated in FIG. 9 in each of the electro-optical devices 10G, 10B is similar to the above-described manufacturing method of the main components of the pixel region 12R of the pixel circuit of the electro-optical device 10R according to the second embodiment. However, in the manufacturing method of the main components of the pixel regions 12G, 12B of the pixel circuit of each of the electro-optical devices 10G, 10B according to the second embodiment, when forming each of the conductive layers UR, UB in place of the conductive layer UR, the thicknesses of the conductive materials constituting the conductive layers UG, UB are adjusted so as to satisfy the above-described relationship between the thicknesses tR, tG, tB, that is, so as to cause the thickness tB to be thinner than both the thicknesses tG, tR.

Since the above-described electro-optical device 10G according to the second embodiment has the same configuration as that of the electro-optical device 10G of the first embodiment, the electro-optical device 10G according to the second embodiment achieves the same effects as those of the electro-optical device 10G according to the first embodiment.

Further, in the optical modulation device 1 according to the first embodiment, the insulating layer 65 of the electro-optical device 10R is provided so as to cover the end portions E1e of the first electrode E1 and the end portions URe of the conductive layer UR in plan view, whereas in the second embodiment, the electro-optical device 10R includes the second insulating layer 162 of the insulating layer 65 between the first electrode E1 and the light-emitting layer 46. In plan view, the second insulating layer 162 of the insulating layer 65 covers the end portions E1e of the first electrode E1, and is provided in a region different from the conductive layer UR. In other words, in the second embodiment, the peripheral edge portions of the second insulating layer 162 of the insulating layer 65 and the conductive layer UR are provided on the surface of the second conductive layer 152 of the first electrode E1, and are disposed with a gap provided therebetween in plan view. The light-emitting layer 46 is provided between the peripheral edge portions of the second insulating layer 162 and the conductive layer UR. In each of the electro-optical devices 10G, 10B according to the second embodiment also, the insulating layer 65 can be disposed in a similar manner as in the electro-optical device 10R of the second embodiment, with respect to the first electrode E1 and the conductive layer UG, UB.

In the optical modulation device 1 according to the second embodiment, when the size of the opening 200 of each of the electro-optical devices 10R, 10G, 10B is similar to that of the electro-optical devices 10R, 10G, 10B of the optical modulating device 1 according to the first embodiment, the sizes of the conductive layers UR, UG, UB of the pixels 11R, 11G, 11B are smaller than the sizes of the conductive layers UR, UG, UB of the first embodiment. With such a configuration, the height of the surface, that is, the position in the Z direction of the conductive layer UR, UG, or UB is changed in two stages, and can be reduced from the three stages in the first embodiment. According to the optical modulation device 1 of the second embodiment, steps of the conductive layer UR, UG, UB are reduced, and thus an occurrence of abnormal light emission due to the steps is suppressed. Further, according to the optical modulation device 1 of the second embodiment, in plan view, the resistance of a central portion, of the first electrode E1, overlapping with each of the conductive layers UR, UG, UB can be made lower than that of end portions that are different from each of the conductive layers UR, UG, UB, for example, the end portions URe, and thus the occurrence of the abnormal light emission at peripheral edge portions of the pixels 11R, 11G, 11B can be suppressed.

Although not illustrated, according to the head-mounted display (display device) 1000 including the optical modulation device 1 according to the second embodiment in place of the optical modulation device 1 according to the first embodiment, even after a certain time period elapsed from the time of the initial driving, the color shift of the image to be observed can be suppressed, and further, the occurrence of the abnormal light emission at the peripheral edge portions of the pixels 11R, 11G, 11B can be suppressed. As a result, a high quality can be maintained.

Although preferable embodiments of the present disclosure are described above in detail, the present disclosure is not limited to those specific embodiments, and can be modified or changed in various manners without departing from the gist of the present disclosure described in the claims. In each of the embodiments described above, actions and effects deserving special mention are described. However, although details are not described herein, actions and effects of other embodiments, to which a configuration including the above-described optical modulation device and display device can be applied, are also obtained.

Further, the head-mounted display is described above as the display device including the optical modulation device according to the present disclosure, but the display device according to the present disclosure is not limited to the head-mounted display, and may be a projector, for example. Further, a wide variety of virtual image display devices can be configured by combining the optical modulation device according to the present disclosure and an optical system using a light-guiding plate, a half mirror, and a hologram.

Figure 10:
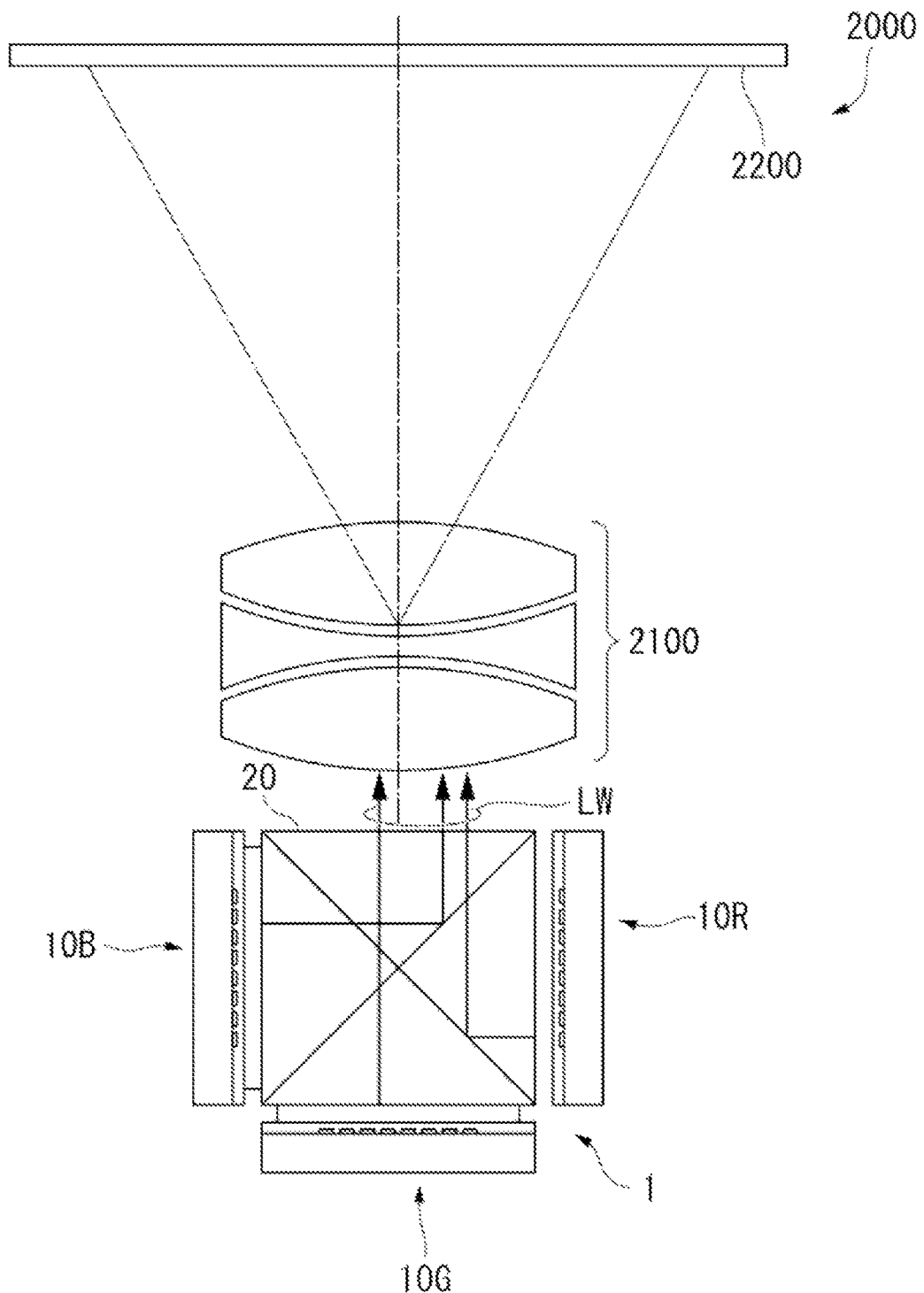
FIG. 10 is a schematic view illustrating a configuration of a display device according to the present disclosure.

FIG. 10 is a schematic diagram illustrating a configuration of a projector 2000 including the optical modulation device 1 described above. For example, as illustrated in FIG. 10, the projector 2000 includes the optical modulation device 1 and a projection optical system (optical system) 2100, which enlarges and projects the synthesized image light LW emitted from the optical modulation device 1 onto a screen 2200. According to the projector 2000, the white balance of the synthesized image light LW projected onto the screen 2200 is optimized, and the power consumption of each of the electro-optical devices 10G, 10B can be reduced compared to that of the electro-optical device 10R.

An optical modulation device according to an aspect of the present disclosure may be configured as follows. An optical modulation device according to an aspect of the present disclosure includes a first electro-optical device including a first light-emitting element including a light-emitting layer emitting light including a red wavelength region, a second electro-optical device including a second light-emitting element including a light-emitting layer emitting light including a green wavelength region, a third electro-optical device including a third light-emitting element including a light-emitting layer emitting light including a blue wavelength region, and a prism configured to synthesize light emitted from the first electro-optical device, the second electro-optical device, and the third electro-optical device. Each of the first light-emitting element, the second light-emitting element and the third light-emitting element includes a first electrode, a second electrode, and a conductive layer provided between the first electrode and the light-emitting layer, and having a lower reflectance with respect to the light emitted from the light-emitting layer than a reflectance of the first electrode, and a thickness of the conductive layer of the third light-emitting element is thinner than a thickness of the conductive layer of the first light-emitting element and a thickness of the conductive layer of the second light-emitting element.

In an optical modulation device according to an aspect of the present disclosure, the thickness of the conductive layer of the first light-emitting element may be equal to or greater than the thickness of the conductive layer of the second light-emitting element, and the thickness of the conductive layer of the second light-emitting element may be thicker than the thickness of the conductive layer of the third light-emitting element.

In an optical modulation device according to an aspect of the present disclosure, each of the first electro-optical device, the second electro-optical device, and the third electro-optical device may include an insulating layer between the first electrode and the light-emitting layer, and the insulating layer may be provided covering an end portion of the first electrode and an end portion of the conductive layer.

In an optical modulation device according to an aspect of the present disclosure, each of the first electro-optical device, the second electro-optical device, and the third electro-optical device may include an insulating layer between the first electrode and the light-emitting layer, and in plan view, the insulating layer may cover an end portion of the first electrode and be provided in a region different from the conductive layer.

In an optical modulation device according to an aspect of the present disclosure, the light-emitting layer may be provided between the conductive layer and the insulating layer.

In an optical modulation device according to an aspect of the present disclosure, the thickness of the conductive layer may be from 0.5 nm to 20 nm.

In an optical modulation device according to an aspect of the present disclosure, a material constituting the conductive layer may contain at least one of Mo, Cr, Ni, or a nitride containing Ti.

A display device according to an aspect of the present disclosure may have the following configuration. A display device includes the optical modulation device described above, and an optical system configured to display light emitted from the optical modulation device.

What is claimed is:

1. An optical modulation device comprising:
   a first electro-optical device including a first light-emitting element including a light-emitting layer emitting light including a red wavelength region;
   a second electro-optical device including a second light-emitting element including a light-emitting layer emitting light including a green wavelength region;
   a third electro-optical device including a third light-emitting element including a light-emitting layer emitting light including a blue wavelength region; and
   a prism configured to synthesize light emitted from the first electro-optical device, the second electro-optical device, and the third electro-optical device, wherein
   each of the first light-emitting element, the second light-emitting element and the third light-emitting element includes
      a first electrode,
      a second electrode, and
      a conductive layer provided between the first electrode and the light-emitting layer, and having a lower reflectance with respect to the light emitted from the light-emitting layer than a reflectance of the first electrode, and
   a thickness of the conductive layer of the third light-emitting element is thinner than a thickness of the conductive layer of the first light-emitting element and a thickness of the conductive layer of the second light-emitting element.

2. The optical modulation device according to claim 1, wherein
   the thickness of the conductive layer of the first light-emitting element is equal to or greater than the thickness of the conductive layer of the second light-emitting element, and
   the thickness of the conductive layer of the second light-emitting element is thicker than the thickness of the conductive layer of the third light-emitting element.

3. The optical modulation device according to claim 1, wherein
   each of the first electro-optical device, the second electro-optical device, and the third electro-optical device includes an insulating layer between the first electrode and the light-emitting layer, and
   the insulating layer is provided covering an end portion of the first electrode and an end portion of the conductive layer.

4. The optical modulation device according to claim 3, wherein
   areas of openings formed by the respective insulating layers of the first electro-optical device, the second electro-optical device, and the third electro-optical device are equal to each other.

5. The optical modulation device according to claim 1, wherein
   each of the first electro-optical device, the second electro-optical device, and the third electro-optical device includes an insulating layer between the first electrode and the light-emitting layer, and
   in plan view, the insulating layer covers an end portion of the first electrode and is provided in a region different from the conductive layer.

6. The optical modulation device according to claim 5, wherein
   the light-emitting layer is provided between the conductive layer and the insulating layer.

7. The optical modulation device according to claim 1, wherein
   the thickness of the conductive layer of the first light-emitting element, the thickness of the conductive layer of the second light-emitting element, and the thickness of the conductive layer of the third light-emitting element are each from 0.5 nm to 20 nm.

8. The optical modulation device according to claim 1, wherein
   a material constituting each of the conductive layers contains at least one of Mo, Cr, Ni, or a nitride containing Ti.

9. A display device comprising:
   the optical modulation device according to claim 1; and
   an optical system configured to display light emitted from the optical modulation device.

* * * * *